(12) United States Patent
Kanzaki

(10) Patent No.: US 6,924,485 B2
(45) Date of Patent: Aug. 2, 2005

(54) INFRARED RAY DETECTOR HAVING A VACUUM ENCAPSULATION STRUCTURE

(75) Inventor: Masayuki Kanzaki, Tokyo (JP)

(73) Assignee: NEC Corporation, Tokyo (JP)

( * ) Notice: Subject to any disclaimer, the term of this patent is extended or adjusted under 35 U.S.C. 154(b) by 217 days.

(21) Appl. No.: 10/260,501

(22) Filed: Oct. 1, 2002

(65) Prior Publication Data

US 2003/0062480 A1 Apr. 3, 2003

(30) Foreign Application Priority Data

Oct. 1, 2001 (JP) ........................................ 2001-304826

(51) Int. Cl.⁷ ................ G01J 5/00; G01J 5/08
(52) U.S. Cl. ............... 250/338.1; 250/332; 250/339.02; 257/433
(58) Field of Search .................. 250/338.1, 338.4, 250/338.3, 332; 257/432, 433, 434; 438/57, 66, 69, 73

(56) References Cited

U.S. PATENT DOCUMENTS

| | | | | |
|---|---|---|---|---|
| 5,550,373 A | * | 8/1996 | Cole et al. | 250/338.1 |
| 5,637,907 A | * | 6/1997 | Leedy | 257/434 |
| 5,818,043 A | * | 10/1998 | Buchy et al. | 250/332 |
| 5,895,233 A | * | 4/1999 | Higashi et al. | 438/107 |
| 5,914,488 A | * | 6/1999 | Sone | 250/338.1 |
| RE36,706 E | * | 5/2000 | Cole | 250/349 |
| 6,252,229 B1 | * | 6/2001 | Hays et al. | 250/338.4 |
| 6,429,428 B1 | * | 8/2002 | Parsons et al. | 250/338.2 |
| 6,548,879 B2 | * | 4/2003 | Komobuchi et al. | 257/431 |
| 6,753,526 B2 | * | 6/2004 | Vilain | 250/338.1 |

FOREIGN PATENT DOCUMENTS

| | | |
|---|---|---|
| JP | 2-19725 | 1/1990 |
| JP | 5-157622 | 6/1993 |
| JP | 8-159866 | 6/1996 |
| JP | 8-327448 | 12/1996 |
| JP | 9-15037 | 1/1997 |
| JP | A 9-506712 | 6/1997 |
| JP | 10-281862 | 10/1998 |
| JP | 11-201820 | 7/1999 |
| JP | A 11-326037 | 11/1999 |
| JP | 2000-500577 | 1/2000 |
| JP | 2000-255203 | 9/2000 |

* cited by examiner

Primary Examiner—Albert Gagliardi
(74) Attorney, Agent, or Firm—Young & Thompson

(57) ABSTRACT

An infrared ray detector includes an array of pixels each including a micro-bridge structure wherein a diaphragm is supported in spaced relationship with a substrate by a beam structure. Each pixel has a vacuum encapsulation structure supported in a base area wherein the beam structure is supported by the substrate. The vacuum encapsulation structure includes a window film encapsulating first and second vacuum spaces formed by removing first and second sacrificial films sandwiching therebetween the diaphragm.

11 Claims, 35 Drawing Sheets

INFRARED RAY DETECTOR HAVING A VACUUM ENCAPSULATION STRUCTURE

BACKGROUND OF THE INVENTION (a) Field of the Invention

The present invention relates to an infrared ray detector having a vacuum encapsulation structure and, more particularly, to an improvement of an infrared ray detector in the vacuum encapsulation structure. The present invention also relates to a method for fabricating such an infrared ray detector.

(b) Description of the Related Art

A thermo-sensitive infrared Tay detector (hereinafter referred to as simply infrared ray detector) has a function for absorbing infrared ray irradiated from an object to convert the same into heat by using an infrared-ray receiving film having an optical resonator structure. The heat converted from the infrared ray raises the thermo-sensitive resistor such as a bolometer film constituting a diaphragm having a micro-bridge structure to change the resistance of the resistor, allowing the temperature of the object to be determined based on the change of the resistance.

FIG. 41 shows the structure of a conventional infrared ray detector, which includes a plurality of pixels each having an infrared ray receiving section (or photoreceptor section) 19 formed by a plurality of protective films 5, 7 and 9, such as made of silicon nitride, for absorbing incident infrared ray and a bolometer film 6 sandwiched between the protective films 5 and 7. The photoreceptor section 19 is supported in spaced relationship with a substrate 1 including a read-out circuit by metallic interconnects etc. constituting a beam structure 18 to be thermally isolated from the substrate 1. Infrared ray incident onto the photoreceptor section 19 raises the temperature of the photoreceptor section 19 to change the resistance of the bolometer film 6 as one of thermo-sensitive materials constituting the photoreceptor section 19.

The infrared ray detector as described above is received in a vacuum package, whereby a hollow section, or vacuum space, 20 is maintained at a vacuum to intercept the heat flowing from the photoreceptor section 19 to the underlying substrate 1 and the heat radiation from the photoreceptor section 19 is effected only by the beam 18. By reducing the heat conductivity of the beam 18, an excellent heat isolation structure can be obtained between the photoreceptor section 19 and the substrate 1.

FIG. 42 shows a conventional technique for receiving the infrared ray detector in a vacuum, wherein the wafer on which a plurality of infrared ray detectors are formed is separated into a plurality of chips, each of which is bonded onto a package 21 and encapsulated by a cap member 23 having a window 24 for passing therethrough the incident infrared ray. Before the encapsulation step, each chip is subjected to a wire bonding process wherein the electrodes of the infrared ray detector are bonded onto external pins 22, and then subjected to a evacuation process using an exhaust tube 25.

The procedure for obtaining the infrared ray detector as described above is complicated and not suited to a mass production due to the following reasons. First, since the wafer on which the infrared ray detector array is fabricated has a weak mechanical surface due to the micro-bridge structure thereof, the dicing step for separation into a plurality of chips and the bonding step for each chip should be performed by manual operation, which raises the fabrication costs of the infrared ray detectors.

Second, the evacuation process which involves coupling of each of the packages to an evacuation device by using the exhaust tube is performed for the each of the packages to raise the man-hours for the infrared ray detector, although the plurality of chips are formed at once on a wafer by a series of processes.

Patent Publication JP-A-9-506712 effected for a PCT application describes a vacuum encapsulation process conducted in a wafer level of the infrared ray detectors. The process roughly includes the steps of fabricating a plurality of infrared ray detectors on a wafer, bonding together the wafer and another wafer, on which a plurality of windows are formed, in a vacuum ambient, encapsulating the bonded wafers in the vacuum ambient, and separating the wafer into a plurality of chips.

The process as described in the publication may reduce the costs for man-hours and materials, and also reduce the dimensions of the infrared ray detector modules. However, the process requires a double-surface exposure system for additionally treating the another wafer having the windows as well as a particular wafer-bonding system for bonding together both the wafers with superior dimensional accuracy. Use of these systems also increases the fabrication steps and requires larger man-hours. In addition, the process including a vacuum encapsulation step by using a molten solder material having a large area makes it difficult to maintain the degree of vacuum due to exhaust of the inner gas received in the solder material.

Patent Publication JP-A-11-326037 describes a fabrication process for infrared ray detectors, such as shown in FIG. 43, which includes the steps of bonding together a silicon wafer 26, on which a plurality of infrared ray detectors are formed, and another silicon wafer 27, on which a plurality of windows are formed, in an atmospheric ambient, and evacuating the internal of the bonded wafers by using a through-hole 31 formed in the silicon wafer 27. The process described in this publication has an advantage in that the evacuation step effected after bonding the wafers assures a higher degree of vacuum.

However, the process described in JP-A-11-326037 also requires a particular wafer-bonding system, and in addition, it is difficult to form the through-hole 31 beforehand in the thick wafer 27 mounting thereon the windows and having a large thickness of several hundreds micrometers. Further, the process requires two melting steps for solders, including the steps of melting the bonding solder in the bonding process and melting the vacuum-encapsulation solder in the vacuum encapsulation process. The two melting steps increase the man-hours and thus raise the costs for the infrared ray detectors. Further, it is difficult to maintain a high degree of vacuum in the bonded wafers due to the limited property of the solder, thereby degrading the long-term reliability of the infrared ray detector.

SUMMARY OF THE INVENTION

In view of the above, it is an object of the present invention to provide an infrared ray detector having a vacuum encapsulation structure, which is capable of being encapsulated in the wafer level thereof without using a particular or expensive material and a particular or expensive system.

The present invention provides an infrared ray detector including a substrate and at least one pixel overlying the substrate and having a micro-bridge structure, the pixel including: a diaphragm having therein a bolometer film; a beam structure supporting the diaphragm in spaced relationship with the substrate in a base area of the substrate; and a vacuum encapsulation structure overlying the diaphragm with a vacuum space being disposed therebetween, the vacuum encapsulation structure being supported by the substrate.

The present invention also provides a method for fabricating an infrared ray detector including at least one pixel having a micro-bridge structure, the method including the steps of: forming consecutively a first sacrificial film and a diaphragm overlying a substrate, the diaphragm including a bolometer film having a first through-hole exposing the first sacrificial film; forming consecutively a second sacrificial film and a window film on the diaphragm, the window film having a second through-hole exposing the second sacrificial film; removing the first and second sacrificial films through the second through-hole in association with the first through-hole to form first and second spaces; evacuating the first and second spaces to create a vacuum in the first and second spaces; and forming a vacuum encapsulation film on the window film to fill the second through-hole while maintaining the vacuum in the first and second spaces.

In accordance with the infrared ray detector of the present invention and the infrared ray detector fabricated by the method of the present invention, the vacuum encapsulation structure can be formed in the wafer level of the infrared ray detector. This reduces the damage on the micro-bridge structure after a dicing step for the wafer, and also reduces the costs of the infrared ray detector because the infrared ray detector can be made without using a particular expensive system.

The above and other objects, features and advantages of the present invention will be more apparent from the following description, referring to the accompanying drawings.

PREFERRED EMBODIMENTS OF THE INVENTION

Figure 1:
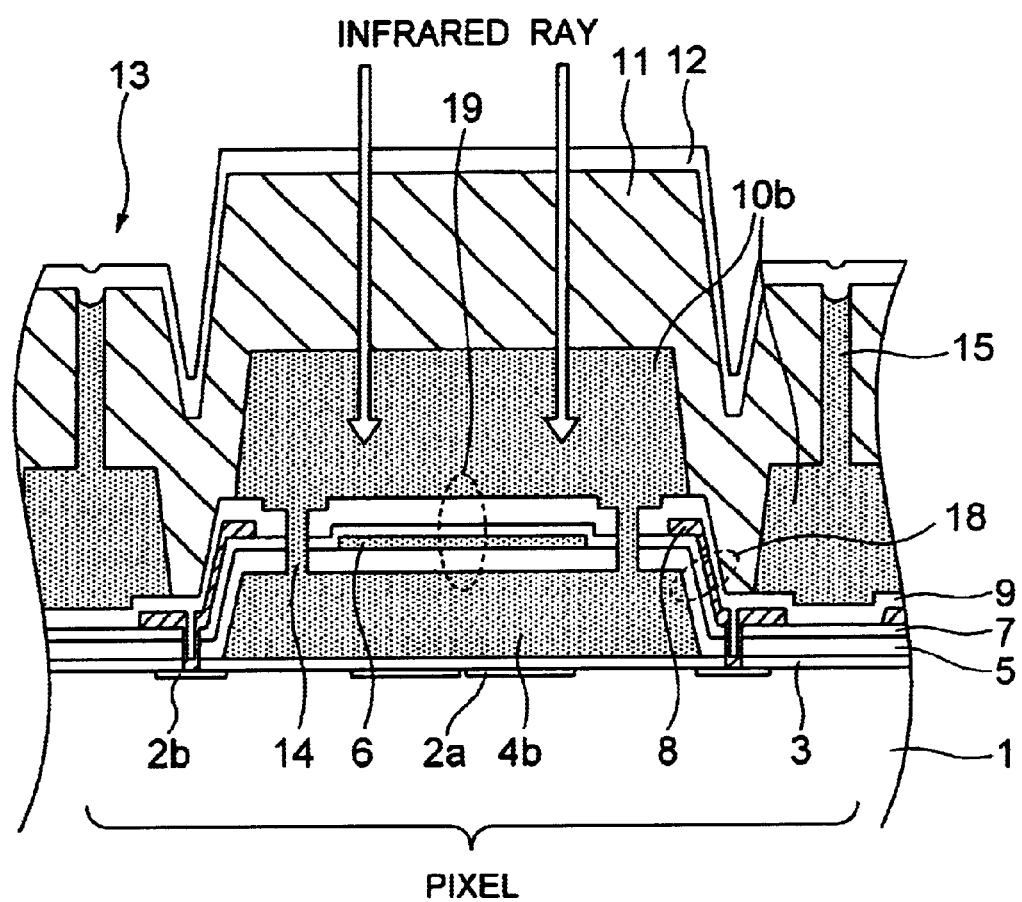
FIG. 1 is a sectional view of an infrared ray detector according to a first embodiment of the present invention.

Now, the present invention is more specifically described with reference to accompanying drawings, wherein similar constituent elements are designated by similar reference numerals throughout the drawings.

Referring to FIGS. 1 to 22, a thermally sensitive infrared ray detector according to a first embodiment of the present invention will be described based on the structure and the manufacturing process thereof which includes a vacuum encapsulation process.

In FIG. 1 showing the structure of the infrared ray detector of the present embodiment, the infrared ray detector includes a substrate 1, on which a read-out circuit and a reflector film 2a for reflecting the incident infrared ray are formed, and a plurality of pixels each including a photoreceptor section 19 supported in spaced relationship with the substrate 1 by a beam structure 18 including a first protective film 5, a second protective film 7, a metallic electrode film 8 and a third protective film 9. The photoreceptor section 19 includes the first protective film 5, a bolometer film 6, the second protective film 7 and the third protective film 9, which are consecutively formed overlying the substrate 1. A window film 11 receiving therethrough the incident infrared ray is supported in spaced relationship with the photoreceptor section 19 by a pair of struts or bases formed in the base areas 13. A vacuum encapsulation film 12 is further formed on the window film 11 over the entire surface.

As described above, the infrared ray detector of FIG. 1 includes an array of pixels each including a diaphragm having a micro-bride structure, which is covered by the window film 11 and the vacuum encapsulation film 12 in spaced relationship therewith. The window film 11 and the vacuum encapsulation film 12 are made of materials having sufficient thicknesses and mechanical strengths that allow the incident infrared ray to pass therethrough as well as to maintain a vacuum in the vacuum spaces 4b and 10b, which are formed by removing first and second sacrificial films 4 and 10, respectively. This structure allows a vacuum encapsulation structure to be formed in the infrared ray detector at the wafer level thereof, whereby the vacuum encapsulation process is not needed for the packaged infrared ray detectors after they are isolated into separate chips and packaged. This reduces the man-hours and improves the throughput of the infrared ray detectors in the fabrication process thereof.

In manufacture of the infrared ray detector of FIG. 1, the process includes consecutive steps shown in FIGS. 2A to 11A as well as FIGS. 2B to 11B. FIGS. 2A to 11A show the consecutive steps in top plan views while depicting 3×3 pixels of the detector and FIGS. 2B to 11B show the consecutive steps in the sectional views taken along line A–A' in FIG. 2A. The steps are also shown in FIGS. 12 to 21, which depict enlarged views of the base area in the steps corresponding to the steps of FIGS. 2B to 11B.

Figure 2A:
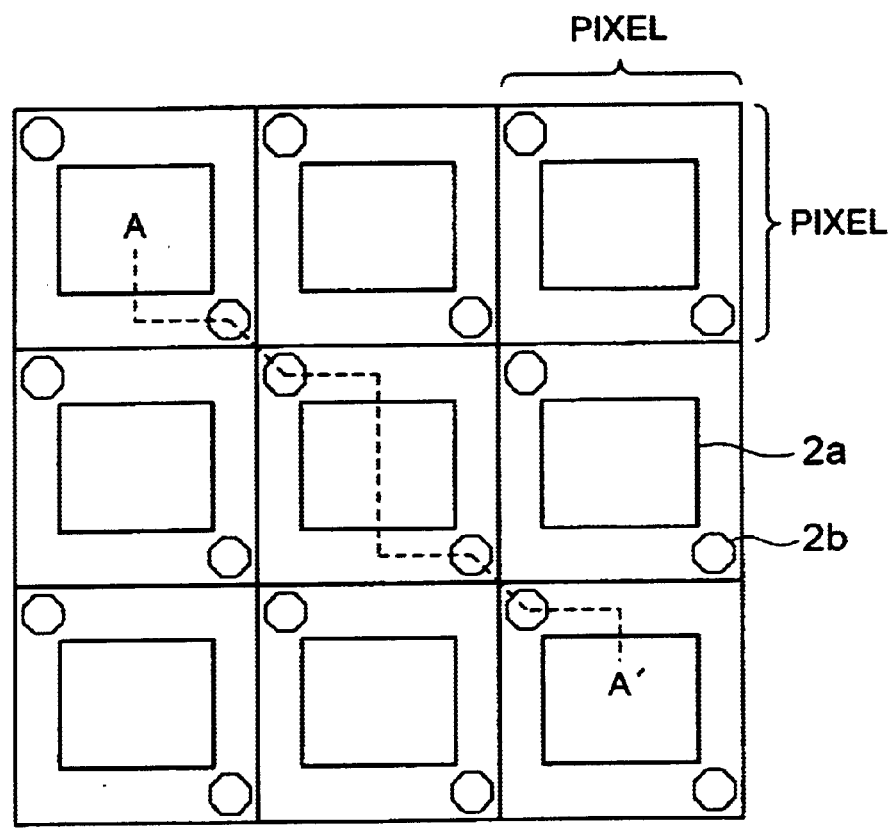
FIG. 2A is top plan view of the infrared ray detector of the first embodiment during a step in a fabrication process thereof.
Figure 2B:
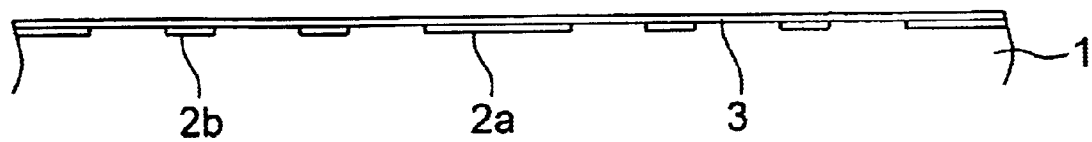
FIG. 2B is a sectional view taken along line A–A' in FIG. 2A.
Figure 12:
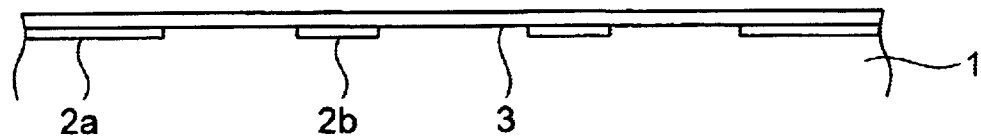
FIG. 12 is an enlarged sectional view illustrating a base area of FIG. 2B in which the beams are fixed onto the substrate.

As shown in FIGS. 2A, 2B and 12, a substrate 1 is prepared on which a read-out circuit including CMOS circuits etc, and a metallic film such as made of Al or Ti having a thickness of about 500 nanometers (nm) is deposited and patterned to form a plurality of reflective films 2a and a pair of electrode cover films 2b in each pixel. The reflective film 2a is disposed for reflecting infrared ray incident onto each pixel, whereas the electrode cover film 2b is disposed for electrically connecting the electrode of the infrared ray detector and the electrode of the substrate 1. A silicon oxide film is deposited thereon as a protective film 3 for protecting the reflective films 2a and the electrode cover films 2b.

Figure 3A:
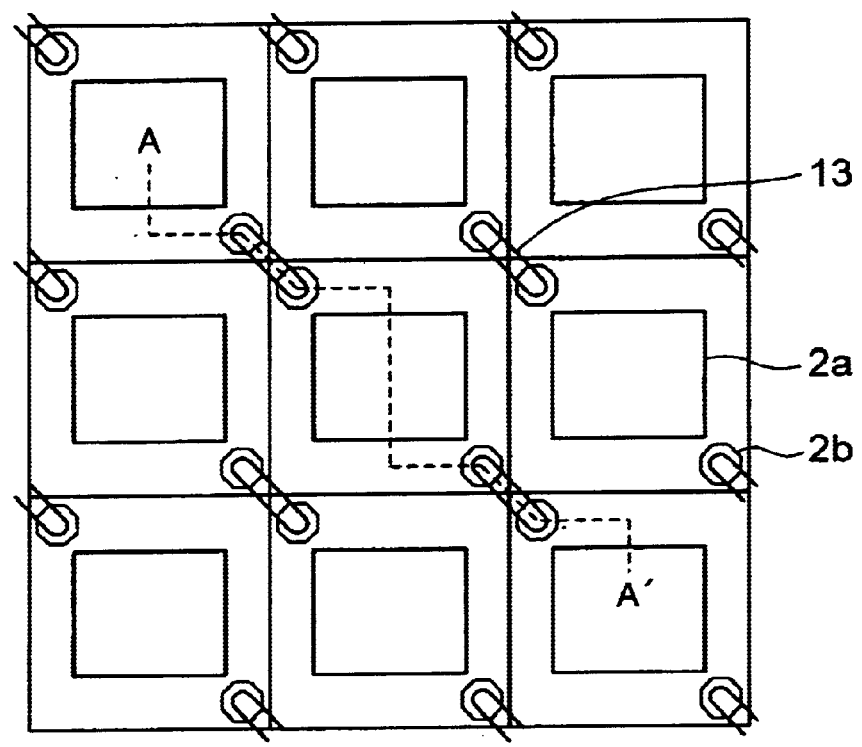
FIG. 3A is top plan view of the infrared ray detector of the first embodiment during a step in the fabrication process thereof.
Figure 3B:
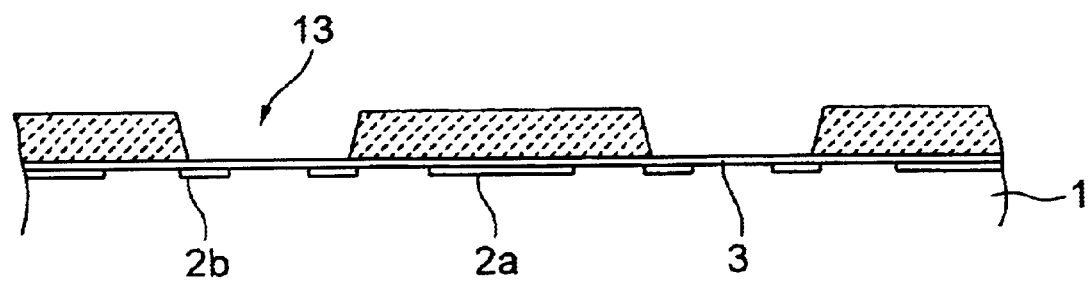
FIG. 3B is a sectional view taken along line A–A' in FIG. 3A.
Figure 13:
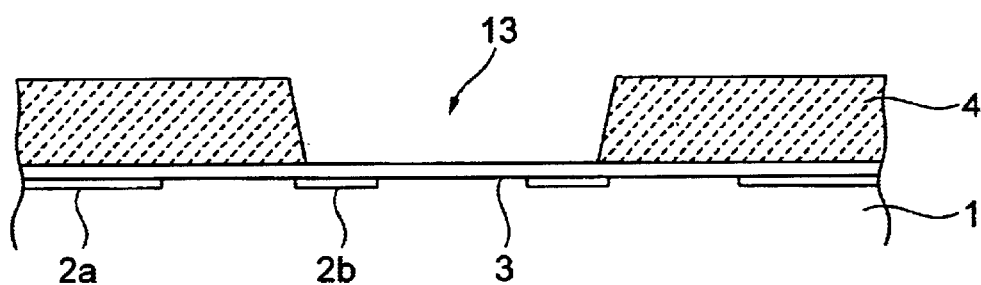
FIG. 13 is an enlarged sectional view illustrating a base area of FIG. 3B in which the beams are fixed onto the substrate.

As shown in FIGS. 3A, 3B and 13, an organic resin film is formed on the entire surface of the substrate 1 by application of photosensitive polyimide, for example, and patterned by exposure and development thereof to form openings in the base areas 13 each receiving therein the electrode cover film 2b. The resultant organic resin film is then baked for curing at a temperature of about 400 degrees C. to form a first sacrificial film 4. The photosensitive polyimide film has a thickness of about 2.5 micrometers after the curing.

Figure 4A:
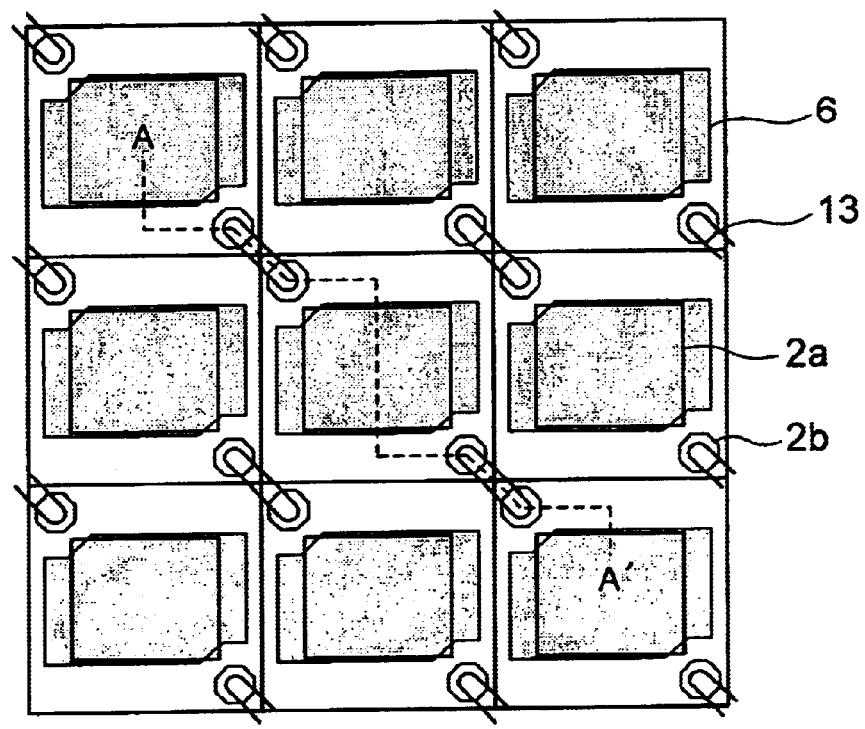
FIG. 4A is top plan view of the infrared ray detector of the first embodiment during a step in the fabrication process thereof.
Figure 4B:
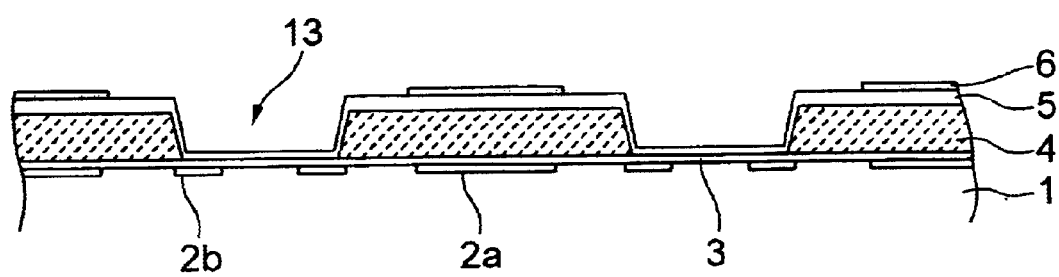
FIG. 4B is a sectional view taken along line A–A' in FIG. 4A.
Figure 14:
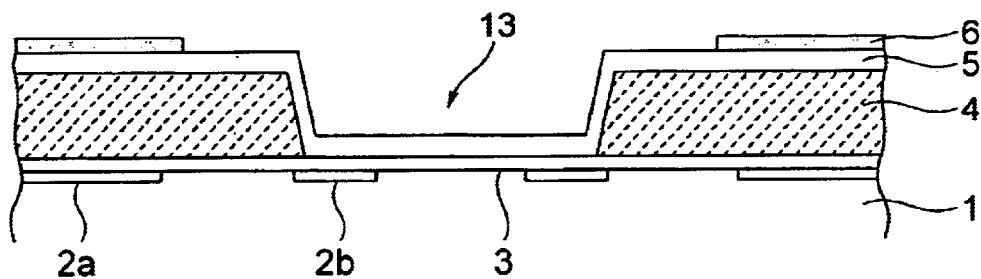
FIG. 14 is an enlarged sectional view illustrating a base area of FIG. 4B in which the beams are fixed onto the substrate.

As shown in FIGS. 4A, 4B and 14, a silicon nitride film having a thickness of about 300 nm is deposited by a plasma-enhanced CVD (PECVD) technique to form a first protective film 5 on the first sacrificial film 4. During the deposition, a mixture of monosilane, ammonium and nitrogen is used as a source gas at a pressure of about 0.6 Torr. Thereafter, vanadium oxide is deposited on the first protective film 5 by a reactive sputtering technique in an oxygen ambient, and patterned by a selective plasma etching using a resist pattern as a mask and fluorine-based material as an etching gas to form a bolometer film 6 in the photoreceptor section 19 of each pixel area. The vanadium oxide film may be replaced by another film having a higher temperature coefficient resistance (TCR) for the bolometer film 6.

Figure 5A:
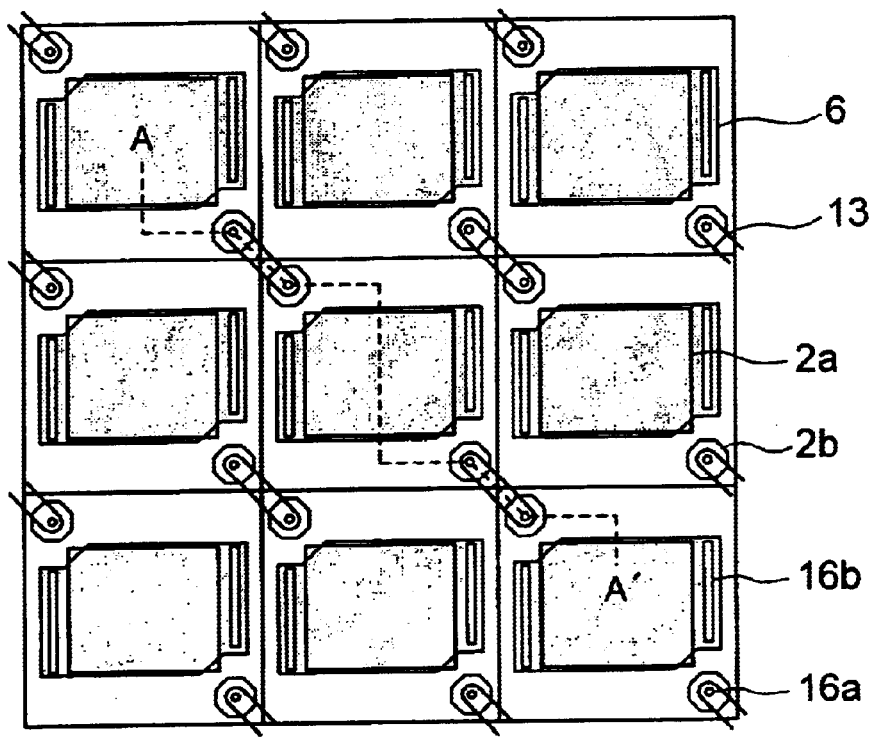
FIG. 5A is top plan view of the infrared ray detector of the first embodiment during a step in the fabrication process thereof.
Figure 5B:
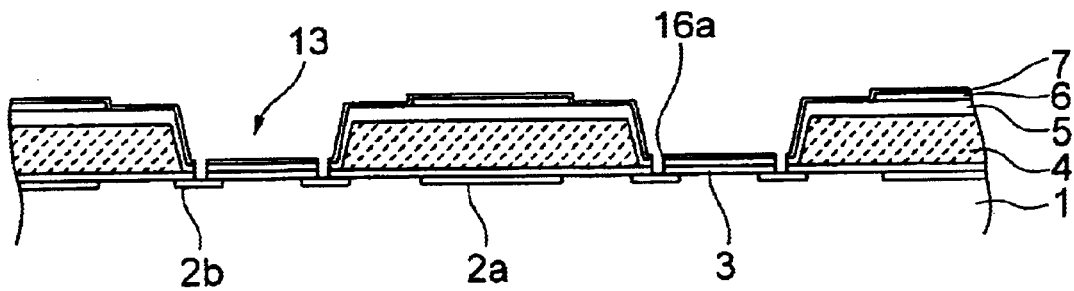
FIG. 5B is a sectional view taken along line A–A' in FIG. 5A.
Figure 15:
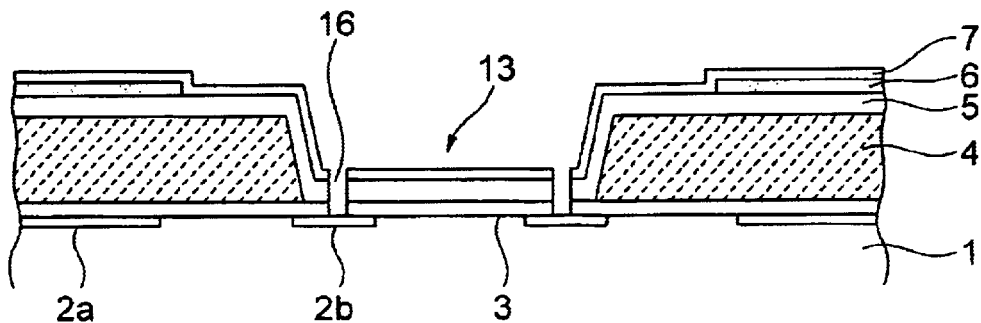
FIG. 15 is an enlarged sectional view illustrating a base area of FIG. 5B in which the beams are fixed onto the substrate.

As shown in FIGS. 5A, 5B and 15, silicon nitride is deposited by a PECVD technique to form a second protective film 7 having a thickness of about 50 nm for protecting the bolometer film 6. The process conditions for the deposition are similar to those for the first protective film 5. Subsequently, a plasma etching process is conducted using a resist pattern as a mask and carbon tetrafluoride as an etching gas to selectively remove portions of the first protective film 5 and the second protective film 7 overlying the electrode cover films 2b and a portion of the second protective film 6 overlying the bolometer film 6 to form contact through-holes 16a and 16b. The through-hole 16a is used for connecting the pixel to the substrate 1, whereas the through-hole 16b is used for connecting the bolometer film to electrodes of the pixel.

Figure 6A:
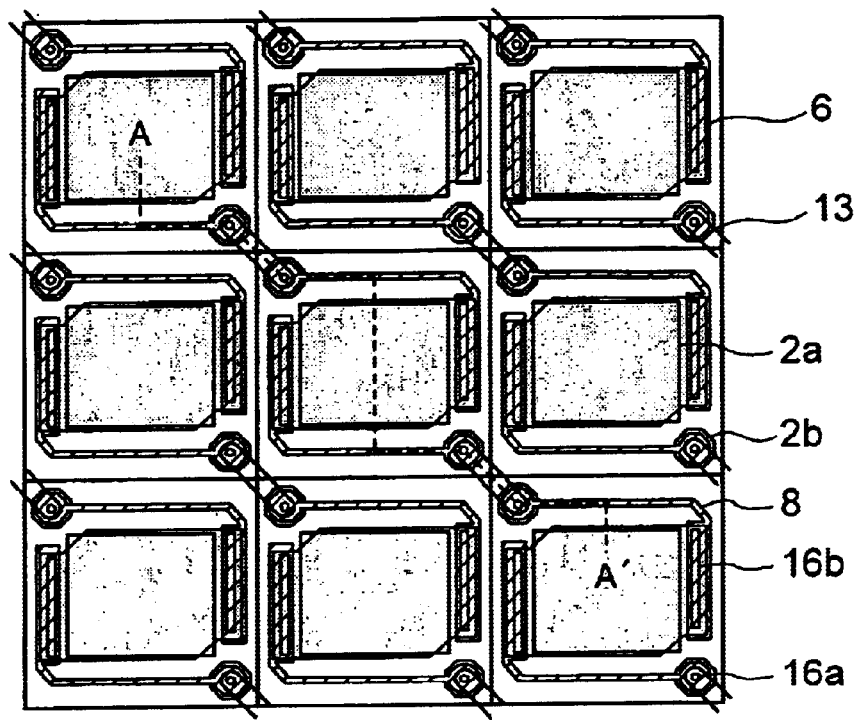
FIG. 6A is top plan view of the infrared ray detector of the first embodiment during a step in the fabrication process thereof.
Figure 6B:
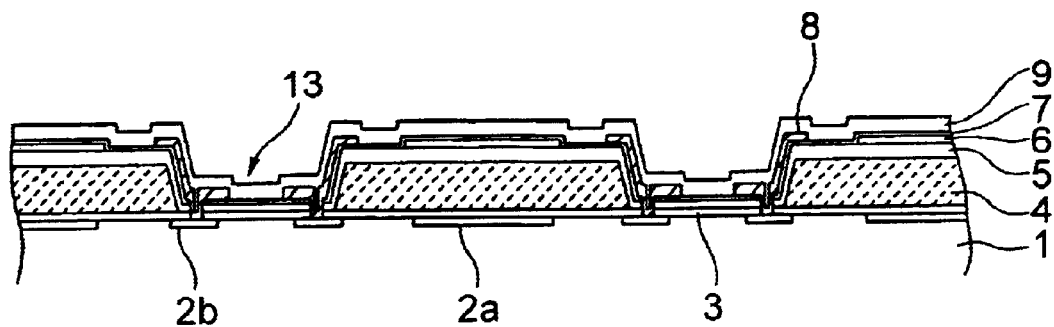
FIG. 6B is a sectional view taken along line A–A' in FIG. 6A.
Figure 16:
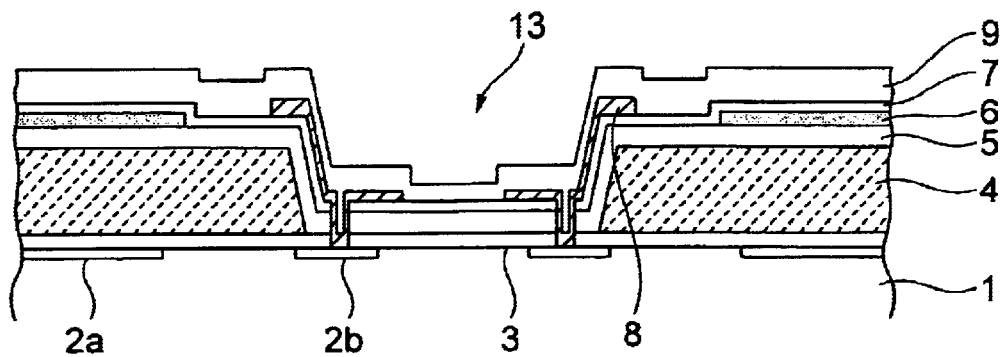
FIG. 16 is an enlarged sectional view illustrating a base area of FIG. 6B in which the beams are fixed onto the substrate.

Thereafter, as shown in FIGS. 6A, 6B and 16, a metallic film such as made of Ti or Ti alloy is deposited by sputtering and selectively etched by a plasma etching process using a mixture of chlorine and boron trichloride as an etching gas to form metallic electrode lines 8. The metallic electrode lines 8 electrically connect the bolometer film 6 with the circuits in the substrate 1 and act as a beam 8 for supporting the bolometer film 6 in spaced relationship with the substrate 1. A silicon nitride film having a thickness of about 300 nm is then deposited by a PECVD technique to form a third protective film 9 for protecting the bolometer film 6 and the metallic electrode lines 8. These configurations allow a micro-bridge structure to be formed by later etching of the first and second sacrificial films 4 and 10, the micro-bridge structure being such that each pixel has a diaphragm and a pair of bases and the diaphragm resides in spaced relationship with the substrate 1 except for the contact therewith via the beam.

Figure 7A:
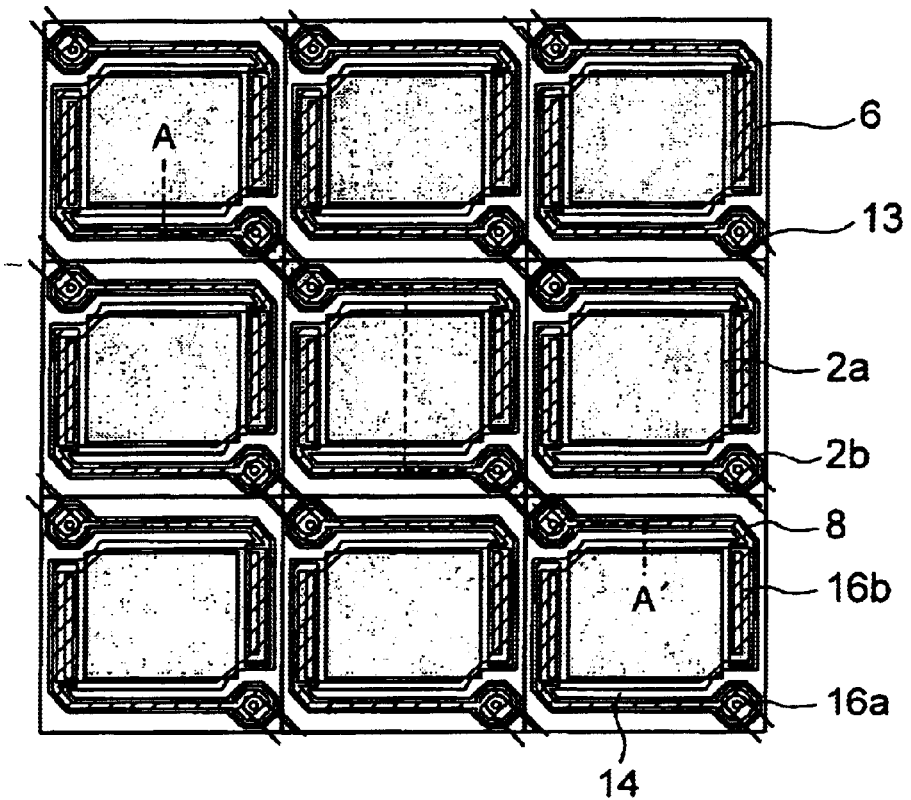
FIG. 7A is top plan view of the infrared ray detector of the first embodiment during a step in the fabrication process thereof.
Figure 7B:
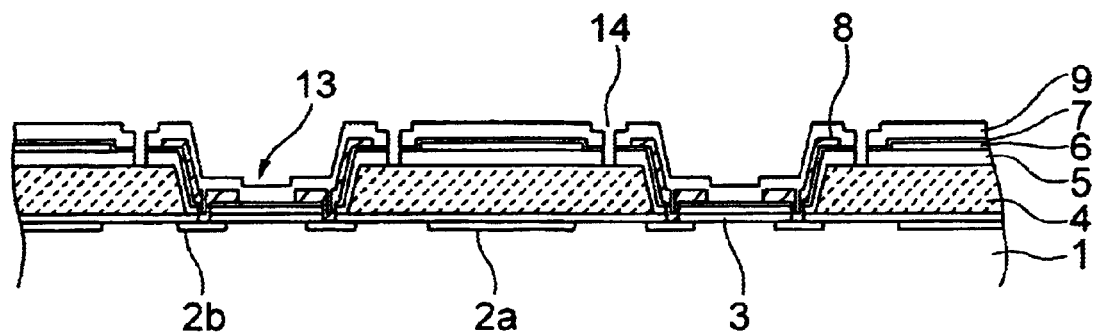
FIG. 7B is a sectional view taken along line A–A' in FIG. 7A.
Figure 17:
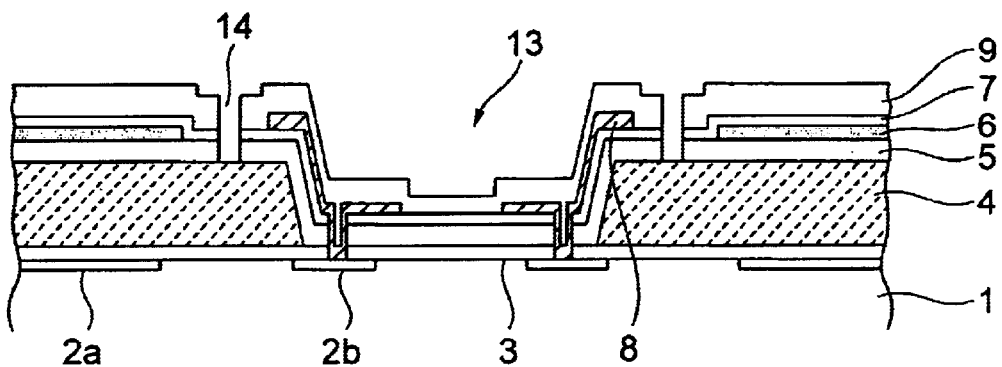
FIG. 17 is an enlarged sectional view illustrating a base area of FIG. 7B in which the beams are fixed onto the substrate.

Subsequently, as shown in FIGS. 7A, 7B and 17, a plasma etching process is conducted using a resist pattern as a mask and a mixture of methane monofluoride and oxygen as an etching gas to selectively etch the first protective film 5, second protective film 7 and third protective film 9, thereby forming a pair of first through-holes 14 in the peripheral areas of each pixel for exposing therethrough portions of the first polyimide sacrificial film 4. The first through-holes 14 thus formed in the peripheral regions of each pixel have elongate sectional areas. The first through-hole 14 should have a larger opening area in view of removing therethrough the first and second sacrificial films, the latter being formed later. After the selective etching for forming the first through-holes 14, the resist pattern is removed by using a dedicated resist-removing liquid instead of an ashing treatment using oxygen plasma in view that the polyimide film is exposed from the first through-holes 14.

Figure 8A:
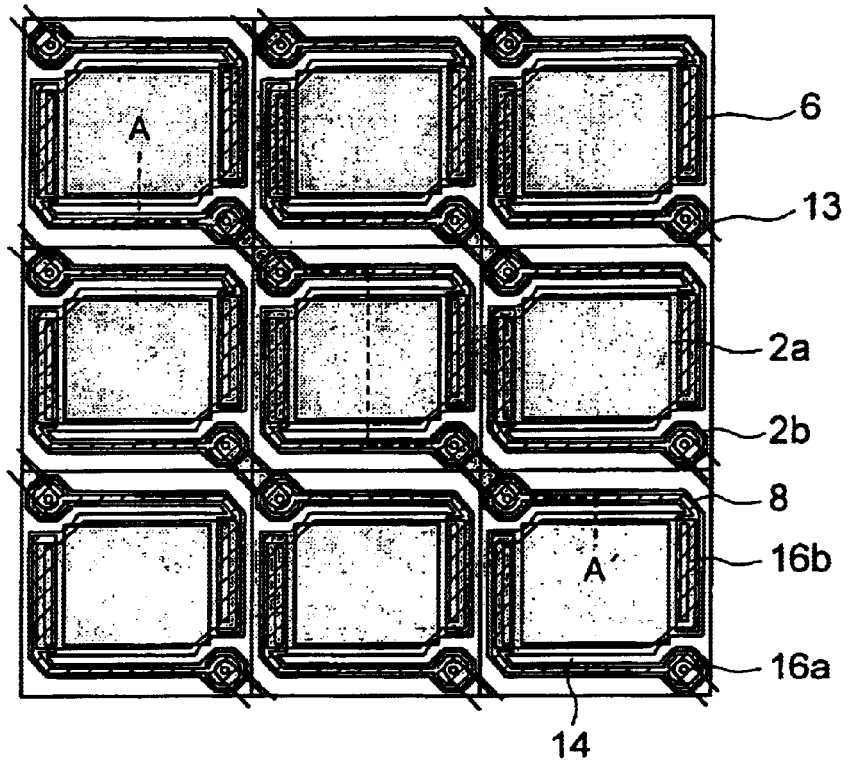
FIG. 8A is top plan view of the infrared ray detector of the first embodiment during a step in the fabrication process thereof.
Figure 8B:
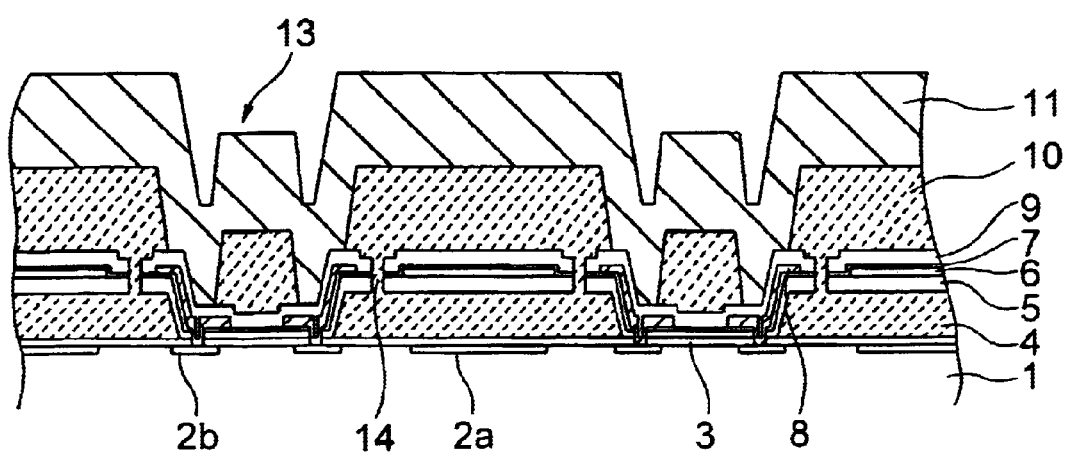
FIG. 8B is a sectional view taken along line A–A' in FIG. 8A.
Figure 18:
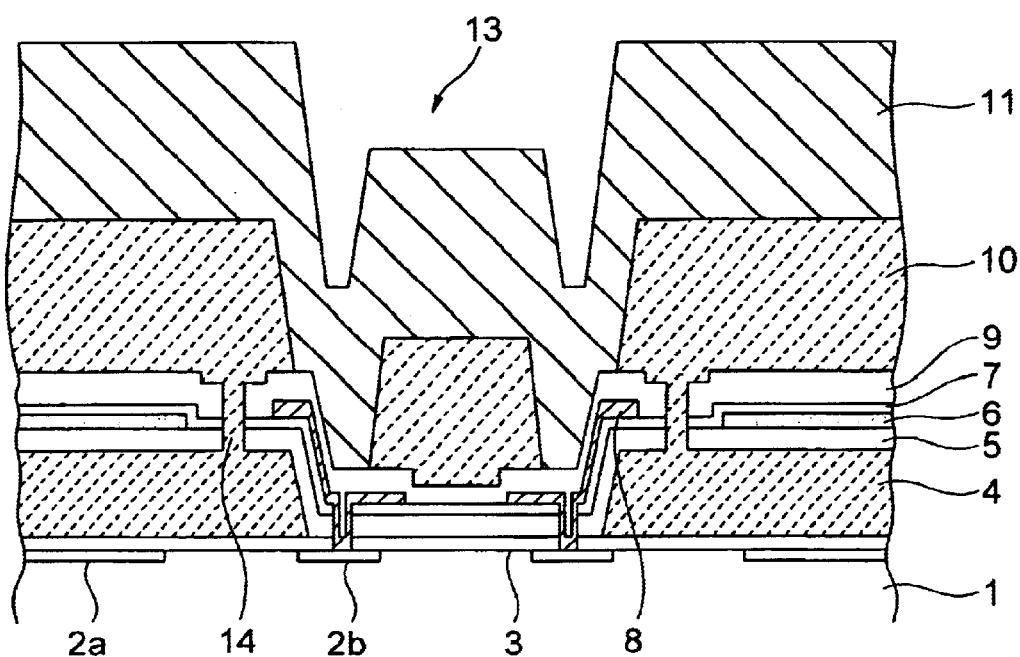
FIG. 18 is an enlarged sectional view illustrating a base area of FIG. 8B in which the beams are fixed onto the substrate.

It is to be noted that although the conventional technique then removes the first sacrificial film 4 by using the first through holes 14 in the next step, the present embodiment forms a vacuum maintaining structure in each pixel before removing the first sacrificial film 4. More specifically, as shown in FIGS. 8A, 8B and 18, an organic resin film such as a photosensitive polyimide film is formed on the entire surface of the substrate 1, and baked for curing at a temperature of about 400 degrees C. to form a second sacrificial film 10. Thereafter, a material for allowing the incident infrared ray to pass therethrough, such as amorphous silicon, is deposited to a specified thickness by a PECVD process using monosilane as a source gas to thereby form a window film 11 for passing therethrough the incident infrared ray.

The second sacrificial film 10 and the window film 11 are used for forming a vacuum space on the photoreceptor section. A larger thickness of the second sacrificial film 10 generally improves the vacuum maintaining function due to a larger vacuum space, whereas an excessively larger thickness thereof reduces the mechanical strength of the window film 11. A larger thickness is preferable for the window film 11 due to a larger mechanical strength thereof, whereas an excessively larger thickness thereof reduces the transmittance of the infrared ray passing therethrough and makes it difficult to form the second through-holes 15 in the window film 11.

Thus, the thicknesses of the second sacrificial film 10 and the window film 11 should be designed depending on the desired degree of vacuum in the vacuum space and the dimensions of the infrared ray detector. In the experiments conducted by the present inventor revealed that a preferable thickness of the second sacrificial film 10 resides in the range between 2 and 10 micrometers, whereas a preferable thickness of the window film 11 resides in the range between 2 and 50 micrometers. In the present embodiment, the second sacrificial film 10 and the window film 11 have thicknesses of about 5 and about 20 micrometers, respectively.

In the present embodiment, the window film 11 is made of amorphous silicon. However, other materials may be used for the window film 11 so long as the other materials allow the incident infrared ray to pass therethrough and are suitably formed as thin films. Examples of the materials for the window film 11 include polysilicon, copper chloride (CuCl), germanium, zinc selenide (ZnSe), zinc sulfide (ZnS), cadmium sulfide (CdS) etc. The second sacrificial film 10 may be made of materials different from the material of the first sacrificial film 4 so long as the second sacrificial film 10 can be etched simultaneously with the first sacrificial film 4. Examples of the material for the second sacrificial film include a photosensitive polyimide having a viscosity different from the viscosity of the first sacrificial film 4. An antireflection film such as made of zinc sulfide may be formed on the window film 11.

Figure 9A:
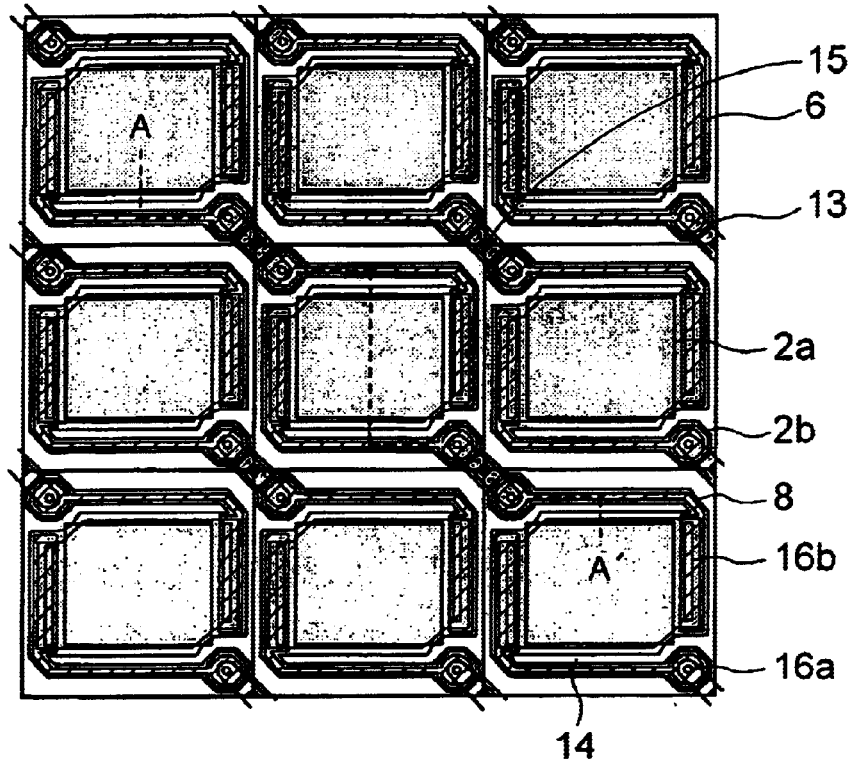
FIG. 9A is top plan view of the infrared ray detector of the first embodiment during a step in the fabrication process thereof.
Figure 9B:
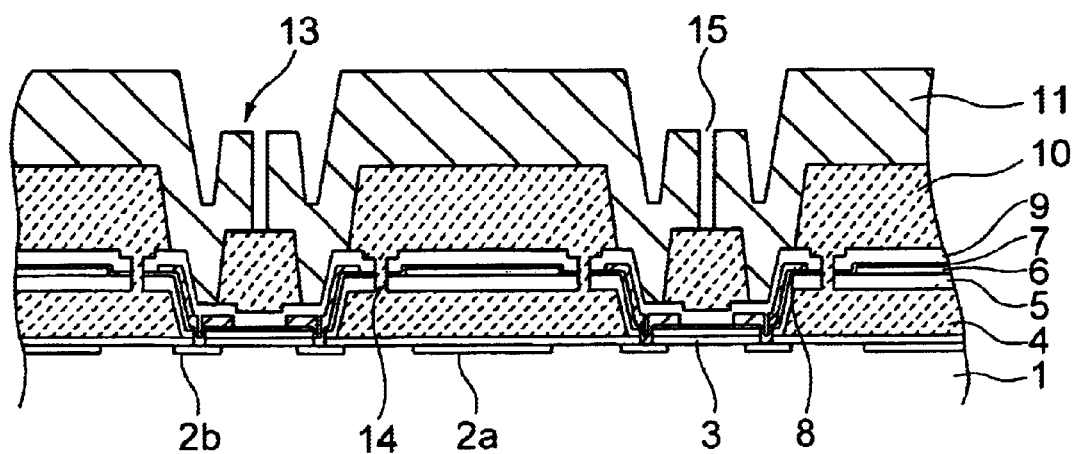
FIG. 9B is a sectional view taken along line A–A' in FIG. 9A.
Figure 19:
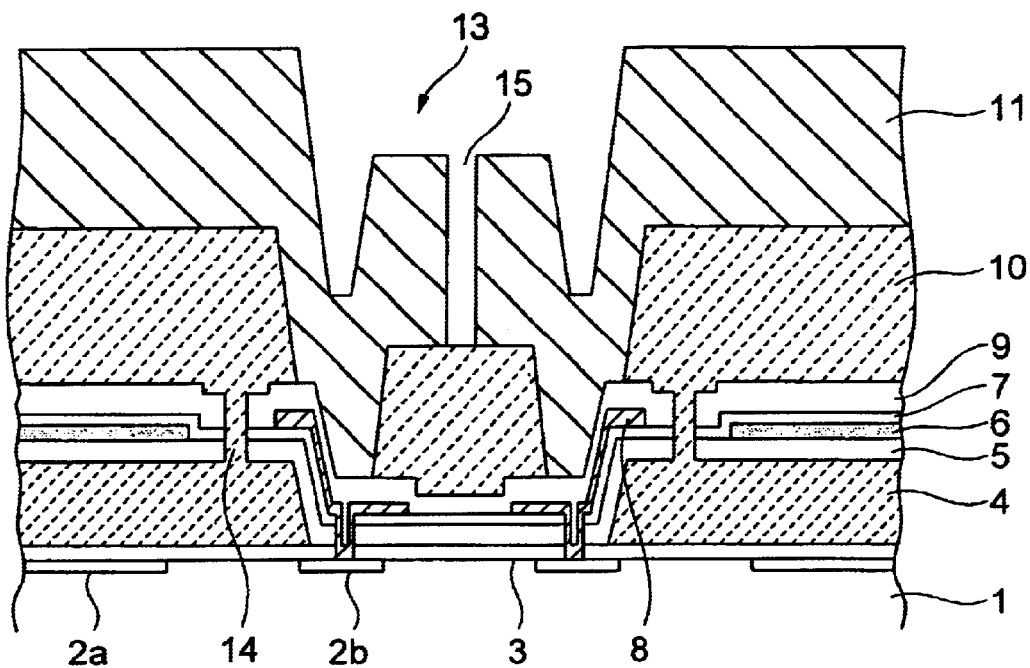
FIG. 19 is an enlarged sectional view illustrating a base area of FIG. 9B in which the beams are fixed onto the substrate.

Thereafter, as shown in FIGS. 9A, 9B and 19, a dry etching process is conducted using a resist pattern as a mask and a mixture of chlorine based gas and fluorine based gas as an etching gas to form second through-holes 15 in the window film 11 overlying the second sacrificial film 10 in the base areas 13, thereby exposing a portion of each second sacrificial film 10. The resist pattern is then removed using a dedicated resist-removing liquid instead of an ashing treatment using oxygen plasma.

The second through-hole 15 is used for removing the second sacrificial film 10 as well as removing the first sacrificial film 4 in association with the first through-hole 14. Thus, a larger opening area is preferable for the second through-hole 15 to reduce the etching time for the sacrificial films 4 and 10. In the present embodiment, the sectional area of the second sacrificial film 10 has a square of about 2.8 micrometers×2.8 micrometers. Although the second through-holes 15 are formed in the base areas 13 in the present embodiment, the second through-hole 15 may be provided in another area so long as the second through-hole exposes the second sacrificial film 10.

Figure 10A:
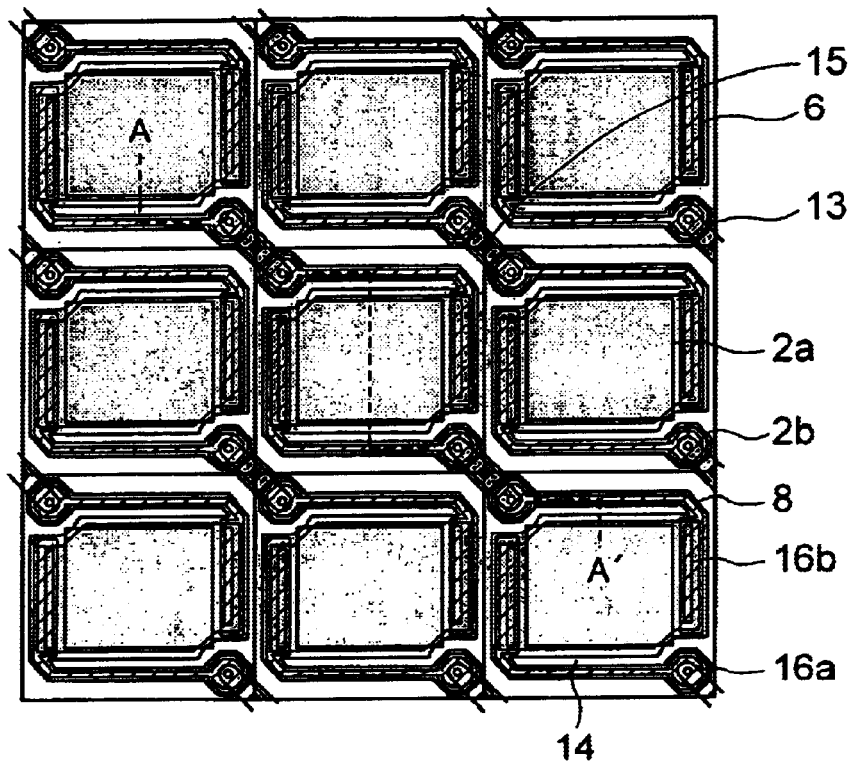
FIG. 10A is top plan view of the infrared ray detector of the first embodiment during a step in the fabrication process thereof.
Figure 10B:
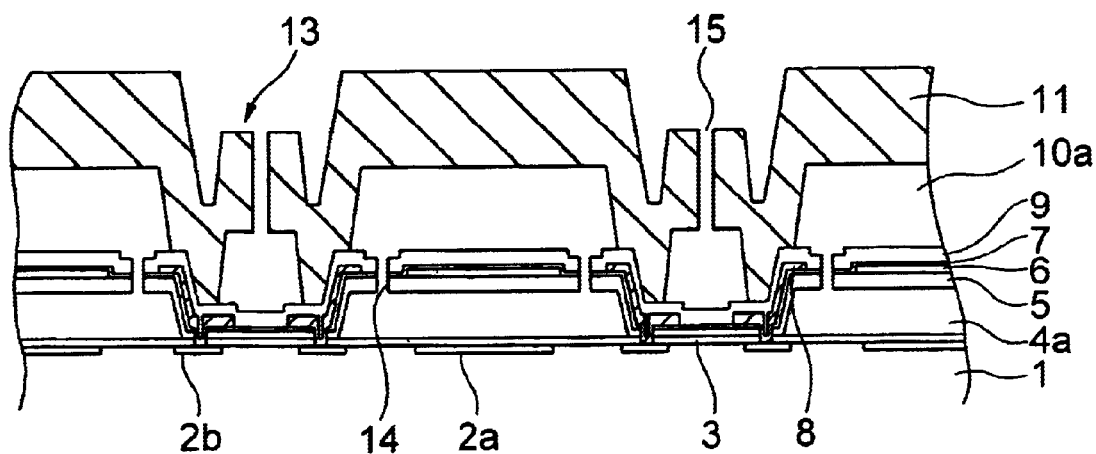
FIG. 10B is a sectional view taken along line A–A' in FIG. 10A.
Figure 20:
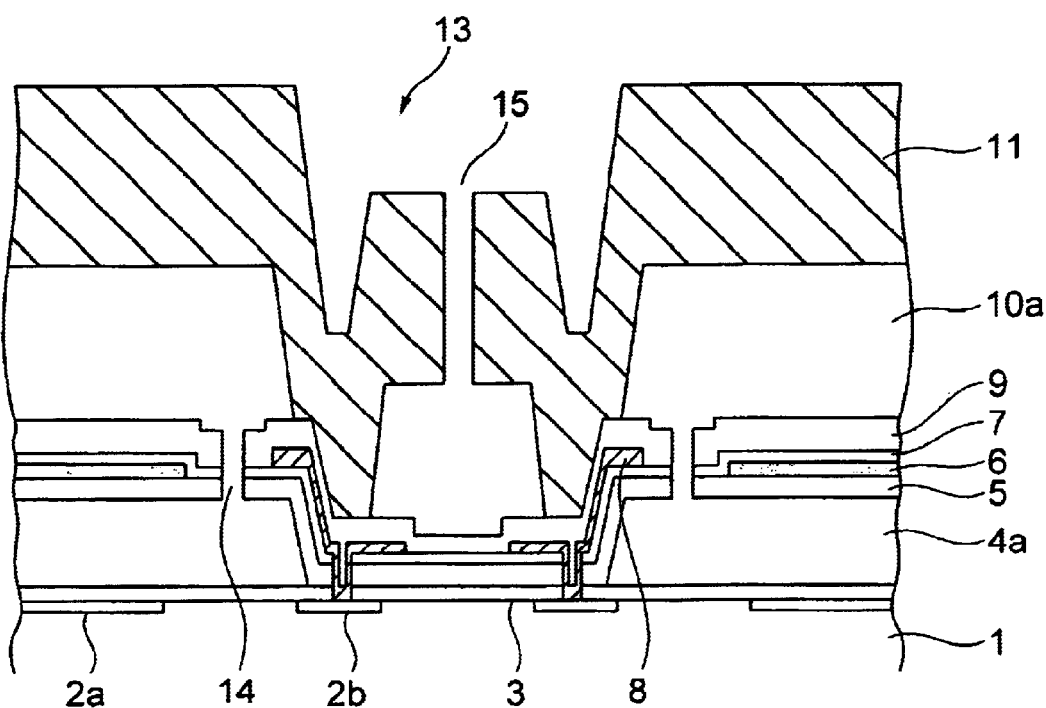
FIG. 20 is an enlarged sectional view illustrating a base area of FIG. 10B in which the beams are fixed onto the substrate.

Subsequently, as shown in FIGS. 10A, 10B and 20, the second sacrificial film 10 and the first sacrificial film 4 are removed through the second through-hole 15 and the first through-hole 14 by an ashing treatment using oxygen at a flow rate of 500 sccm and an ambient pressure of 1.0 Torr, for example. The etching time length depends on the pixel size, thicknesses of the first and second sacrificial films 4 and 10 and the dimensions of the first and second through-holes 14 and 15. In a specific example, the etching time length was about four hours for a photoreceptor section having a pixel size of 37×37 micrometers.

Figure 11A:
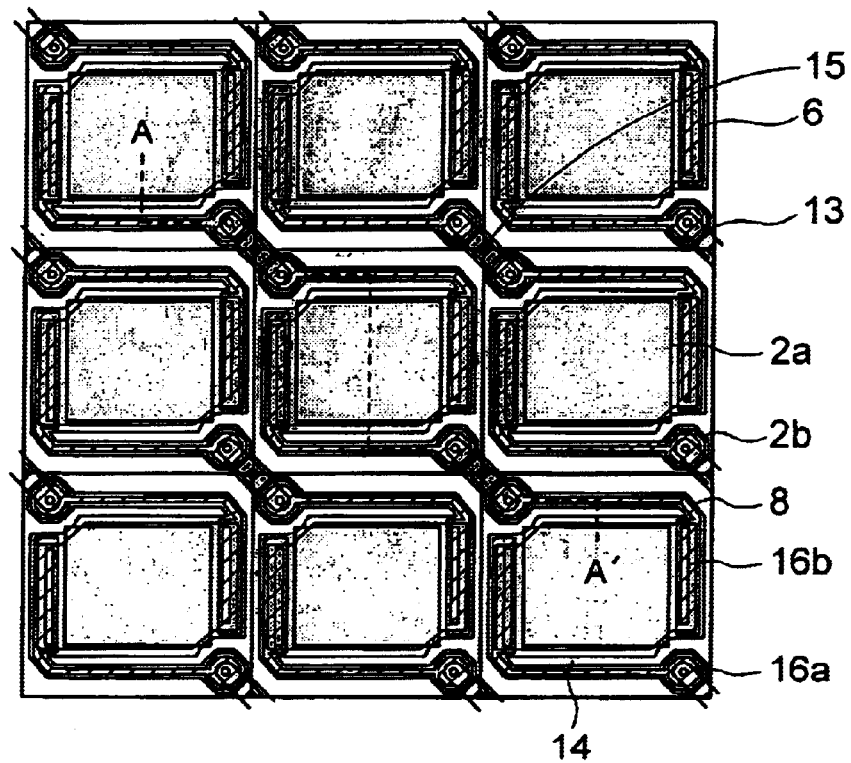
FIG. 11A is top plan view of the infrared ray detector of the first embodiment during a step in the fabrication process thereof.
Figure 11B:
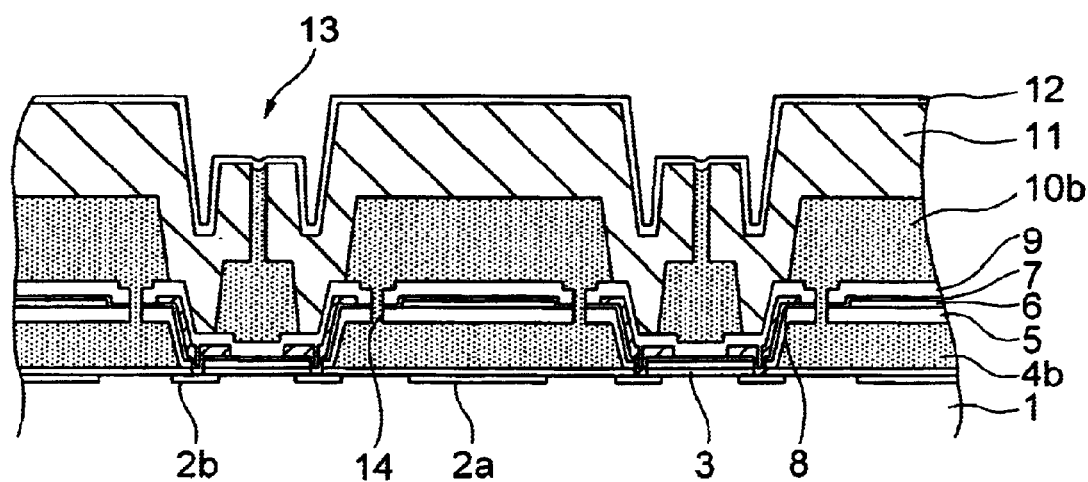
FIG. 11B is a sectional view taken along line A–A' in FIG. 11A.
Figure 21:
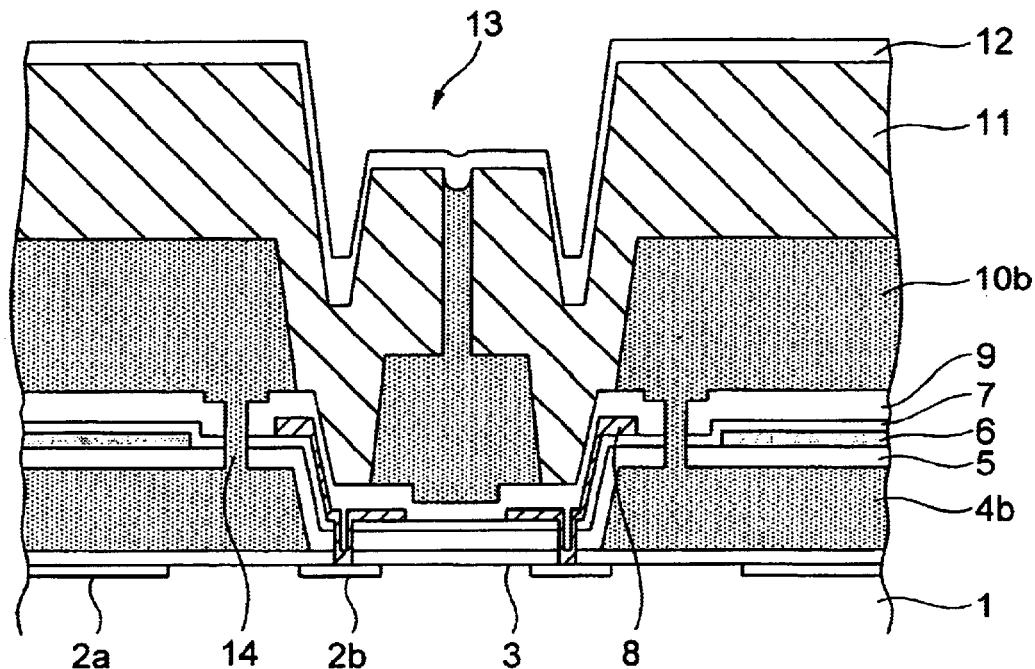
FIG. 21 is an enlarged sectional view illustrating a base area of FIG. 11B in which the beams are fixed onto the substrate.

Thereafter, as shown in FIGS. 11A, 11B and 21, the wafer on which an array of infrared ray detectors each including the window film 11 on the photoreceptor section are formed is introduced in a vacuum deposition chamber, such as a sputtering chamber, wherein the chamber is evacuated to reduce the internal pressure thereof down to $1\times10^{-6}$ Torr. An inert gas is then introduced to the vacuum deposition chamber to increase the internal pressure thereof up to $1\times10^{-2}$ Torr, followed by sputtering of polysilicon to a thickness of about 3 micrometers to form a vacuum encapsulation film 12 on the wafer. The vacuum encapsulation film 12 fills and closes the second through-holes 15, whereby both the space 4b from which the first sacrificial film 4 is removed and the space 10b from which the second sacrificial film 10 is removed are maintained at vacuum.

The degrees of the vacuum after the evacuation and the vacuum after the introduction of the inert gas may be determined based on the performance required of the resultant infrared ray detector. A baking process may be added for deaeration during evacuation of the deposition chamber. In the present embodiment, polysilicon was used for the vacuum encapsulation film 12; however, other materials may be used for this purpose, similarly to the window film 11, so long as the vacuum encapsulation film allows the incident infrared ray to pass therethrough and can be suitably deposited to form a thin film. Examples of the material for the vacuum encapsulation film 12 include amorphous silicon, copper chloride (CuCl), germanium, zinc selenide (ZnSe), zinc sulfide (ZnS), cadmium sulfide (CdS) etc.

After deposition of the vacuum encapsulation film 12 in an experiment, the wafer was extracted from the deposition chamber, and it was found that the internal of the infrared ray detector was maintained at a pressure of $1\times10^{-2}$ Torr due to the function of the vacuum encapsulation film 12 effectively filling the second through-holes 15 and encapsulating other gaps. The wafer was then subjected to a mounting process including the steps of forming bonding pads by using an ordinary technique and isolating the wafer into a plurality of chips by using a dicing technique. The mounting process did not cause any mechanical damages on the window film 11 and the micro-bridge structure, whereby a higher product yield could be achieved in the fabrication of the infrared ray detectors of the present embodiment.

In the infrared ray detector actually fabricated by the above fabrication process, the incident infrared ray having a wavelength range around 10 micrometers and incident on the photoreceptor section passes the silicon film having a thickness of 20 micrometers constituting the window film 11 at a transmittance of almost 100 percents. The infrared ray passed by the window film 11 is absorbed by the silicon nitride film constituting the diaphragm as a main constituent element of the photoreceptor section, which causes a temperature rise with a superior efficiency due to the micro-bridge structure wherein the diaphragm is thermally isolated from the substrate. The bolometer film 6 formed in the diaphragm changes the resistance thereof based on the temperature rise, the resistances of the respective pixels being detected and subjected to a signal treatment by the read-out circuit to obtain an infrared ray image.

In the vacuum space wherein the minute inert gas such as argon is encapsulated at a pressure of about $1\times10^{-2}$ Torr, the micro-bridge structure is isolated from the substrate 1 except for the bases of the beam structure. A pair of bases provided in a single micro-bridge structure thus determine the thermal conductivity between the micro-bridge structure and the substrate 1 at around 0.1 micro-watts/K, and thus achieve an excellent thermal isolation structure for the infrared ray detector.

As described above, the fabrication process of the infrared ray detectors of the present embodiment includes the steps of forming a diaphragm having a micro-bridge structure including a first sacrificial film 4, forming a second sacrificial film 10 having a specified structure before removing the first sacrificial film 4, forming a window film 11 on the second sacrificial film 10, removing the first and second sacrificial films 4 and 10 through the second through-hole 15 formed in the window film 11, and forming a vacuum encapsulation film 12 filling the second through-hole 15 in the window film 11 to encapsulate the infrared ray detector in the wafer level of the infrared ray detectors.

The encapsulation process in the wafer level of the infrared ray detectors significantly reduces the man-hours for the fabrication process, and prevents mechanical damages on the infrared ray detectors during the manual treatment thereof. In addition, since materials including therein spouting gas, such as solder, are not used during the vacuum encapsulation step, the degree of vacuum in the vacuum spaces 4b and 10b is suitably maintained for a long time, thereby raising the long-term reliability of the infrared ray detector.

An infrared ray detector according to a second embodiment of the present invention and a manufacturing process thereof will be described hereinafter. In short, the infrared ray detector of the present embodiment has a thinner second sacrificial film compared to the second sacrificial film in the first embodiment. This reduces the etching time length for the second sacrificial film.

More specifically, in fabrication of the infrared ray detector of the present embodiment, a substrate 1 is prepared having thereon a read-out circuit etc, as in the case of the first embodiment of the present invention. Similarly to the first embodiment, a first sacrificial film 4, a first protective film 5, a bolometer film 6, a second protective film 7, a metallic electrode film 8 and a third protective film 9 are consecutively formed on the substrate 1, followed by forming a first through-hole 14 penetrating the first through third protective films 5, 7 and 9 for exposing a specified portion of the first sacrificial film 4, as shown in FIGS. 2A, 2B, . . . 7A and 7B and FIGS. 12 to 17.

Figure 22:
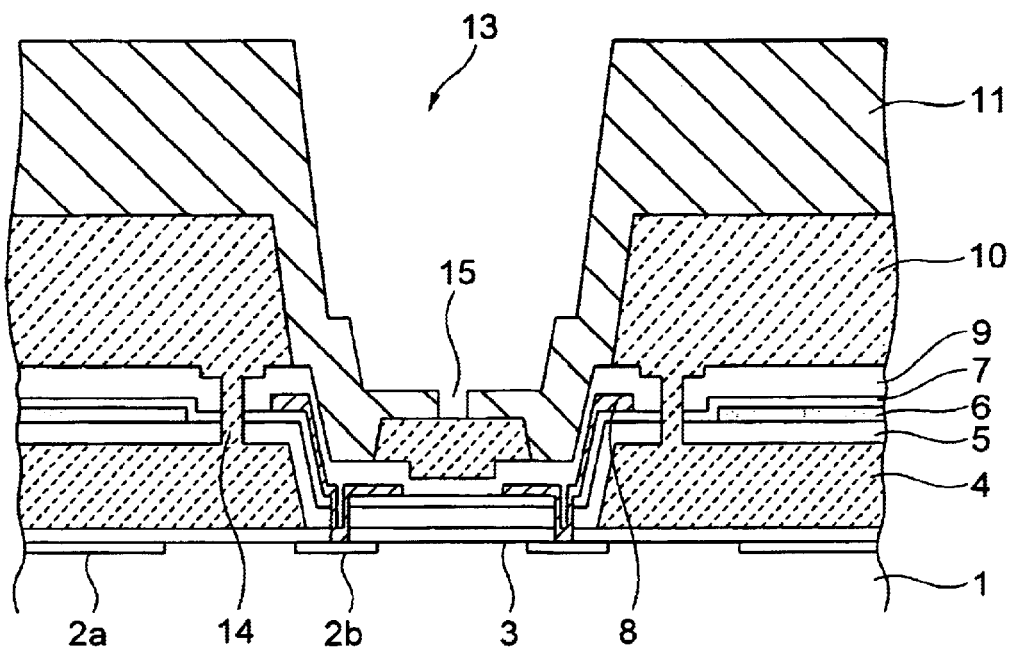
FIG. 22 is a sectional view of an infrared ray detector according to a second embodiment of the present invention during a step in a fabrication process thereof.

Thereafter, as shown in FIG. 22, a second sacrificial film 10 is formed in the photoreceptor section and the base areas 13, the second sacrificial film 10 having a smaller thickness in the base areas 13 than in the photoreceptor section. More specifically, after a photosensitive polyimide film is formed by coating on the entire surface of the substrate 1, the portion of the photosensitive polyimide film on the base areas 13 is more exposed to light than the remaining portions to have a larger solubility in the developer, by using a halftone mask having different light transmittances between in the photoreceptor section and in the base areas 13, or by using iterated exposure steps in the base areas 13.

After the development, the second sacrificial film 10 has a thickness of about 1 micrometer in the base areas 13. Thereafter, amorphous silicon is deposited on the entire surface of the substrate 1 to form a window film 11, followed by partially etching the same by using a resist pattern as a mask and a mixture of chlorine based gas and fluorine base gas as an etching gas to reduce the thickness of the window film 11 in the base areas 13 down to about 1 micrometer. Second through-holes 15 are then formed in the window film 11 in the base areas 13.

Figure 23:
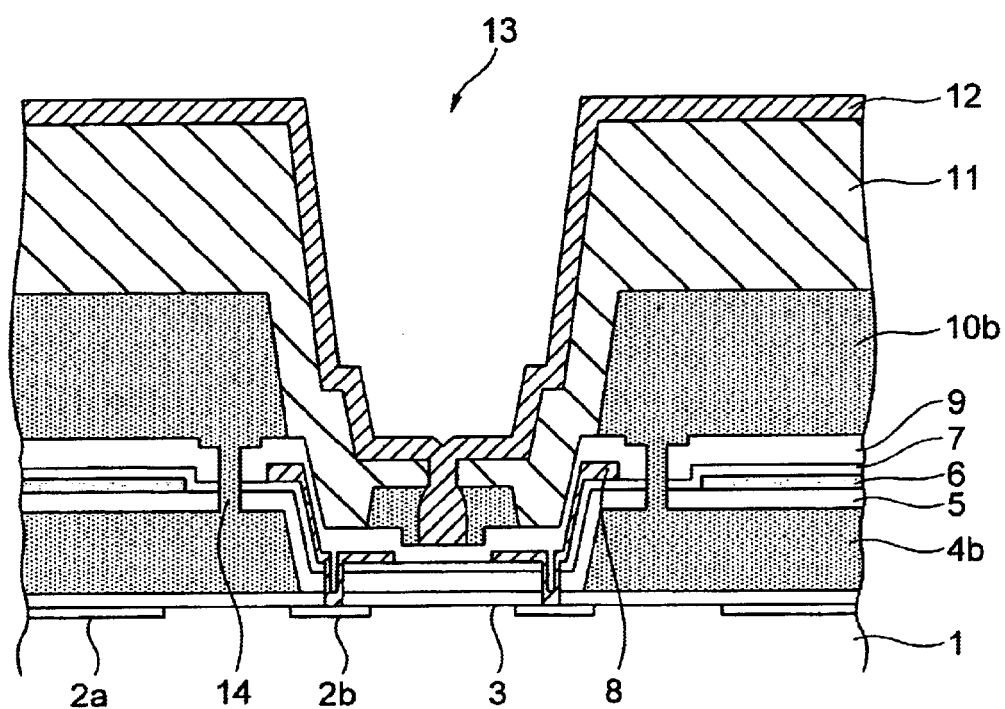
FIG. 23 is a sectional view of the infrared ray detector, according to the second embodiment during a next step in the fabrication process thereof.

Subsequently, as shown in FIG. 23, the first and second sacrificial films 4 and 10 are removed through the second through-holes 15 in association with the first through-holes 14. The resultant wafer on which an array of infrared ray detectors are formed is then introduced in a vacuum deposition chamber, such as a sputtering chamber, which is evacuated to assume a vacuum pressure of $1 \times 10^{-6}$, followed by introduction of inert gas such as argon into the vacuum deposition chamber to assume a vacuum pressure $1 \times 10^{-2}$. A vacuum encapsulation film 12 is then deposited by sputtering while maintaining this pressure.

In the second embodiment, the smaller thickness of the window film 11 in the base areas 13 reduces the aspect ratio of the through-holes 15 whereby the etching time length for the first and second sacrificial films 4 and 10 can be reduced. In one experiment for an infrared ray detector of the second embodiment having a square pixel of 37 microns×37 microns, the etching time length in the second embodiment was below 2 hours, or half the etching time in the first embodiment.

The smaller depth of the second through-hole 15 also assists a safe vacuum encapsulation by the vacuum encapsulation film 12, wherein a thickness of about 3 micrometers for the sputtered polysilicon film or vacuum encapsulation film 12 is sufficient to fill the internal of the second through-hole 15. Further, the direct coupling between the vacuum encapsulation film 12 and the underlying third protective film 9 allows the external wall of the vacuum space formed by the window film 11 and the vacuum encapsulation film 12 to have a larger mechanical strength. In the second embodiment, the subsequent steps were conducted based on ordinary process steps for forming bonding pads and chip separation by dicing. Mechanical damages were not observed in the window film 11 and the micro-bridge structure of the resultant infrared ray detector.

The second embodiment achieves advantages similar to those in the first embodiment, and also achieves reduction of the etching time length for the first and second sacrificial films. The second embodiment further achieves a safe vacuum encapsulation structure and improves the mechanical strength of the external wall of the vacuum space formed by the window film 11 and the vacuum encapsulation film 12.

It is to be noted that the thicknesses of the second sacrificial film 10 and the window film 11 in the base area 13 may be arbitrarily selected depending on the thickness of the vacuum encapsulation film 12, the degree of vacuum in the vacuum spaces and the pixel size.

Figure 24A:
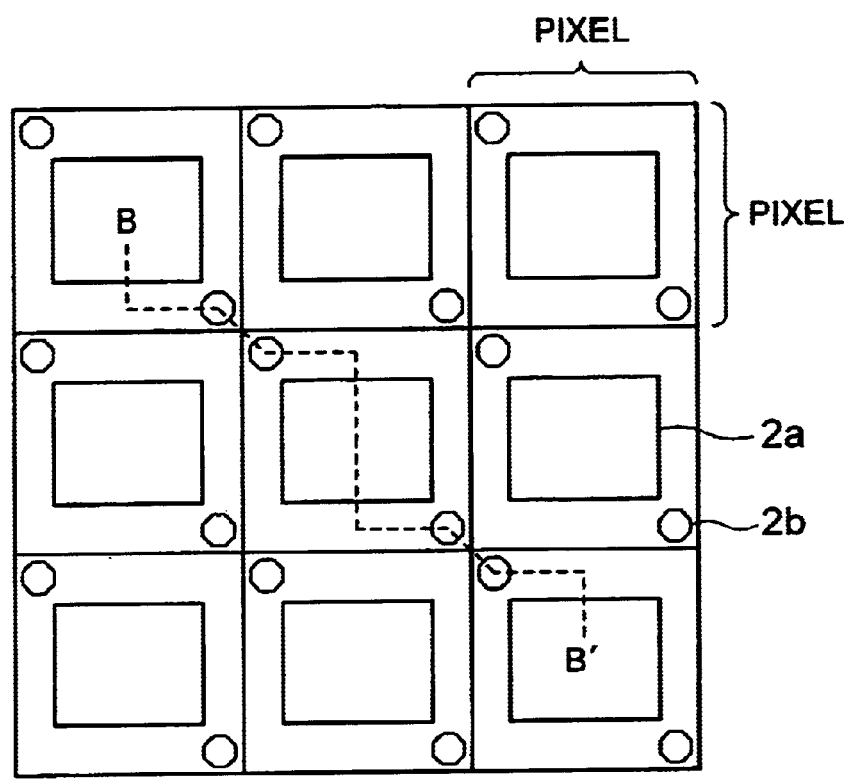
FIG. 24A is a top plan view of an infrared ray detector according to a third embodiment during a step in a fabrication process thereof.

Next, an infrared ray detector according to a third embodiment of the present invention and a manufacturing process thereof will be described hereinafter with reference to FIGS. 24A, 24B, . . . 33A and 33B. In short, the first sacrificial film is additionally formed in the base areas 13 in the third embodiment. FIGS. 24A to 33A each depicts 3×3 pixels, whereas FIGS. 24B to 33B each depicts a sectional view taken along line B–B' in a corresponding one of FIGS. 24A to 33A.

Although the first embodiment has no first sacrificial film 4 in the base areas 13, the second embodiment has a portion of the first sacrificial film 4 in the base areas 13, in view that it is sometimes preferable to provide separate base areas 13 for each pixel, if adjacent pixels have electrodes apart from each other due to a specific arrangement of the pixels. The first sacrificial film 4 in the base areas 13 reduces the step difference between the photoreceptor section and the base areas 13 thereby alleviating the difficulty for forming the window film 11 and the second through-holes 15 therein.

Figure 24B:
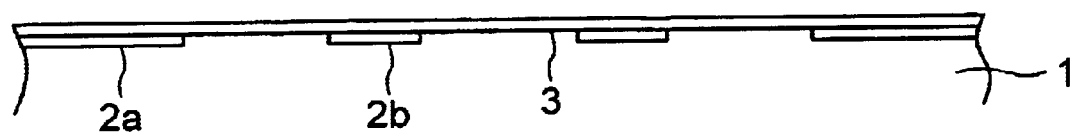
FIG. 24B is a sectional view taken along line B–B' in FIG. 24A.

First, as shown in FIGS. 24A and 24B, a substrate 1 is prepared on which a read-out circuit etc. (not shown) are formed. An array of reflective films 2a each associated with a pair of electrode cover films 2b are formed on the substrate 1, followed by deposition of a protective film 3 on the entire surface of the substrate 1.

Figure 25A:
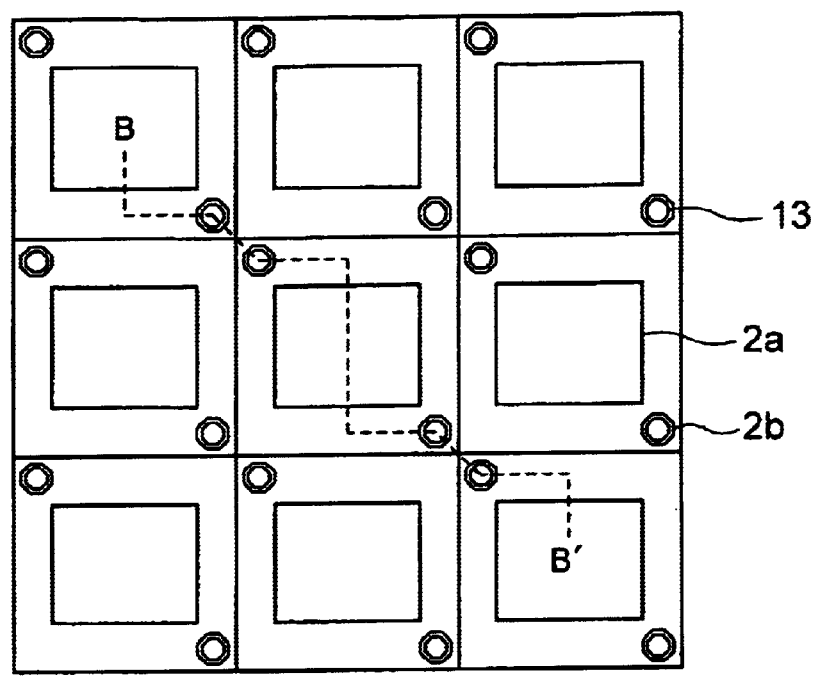
FIG. 25A is a top plan view of the infrared ray detector of the third embodiment during a step in the fabrication process thereof.
Figure 25B:
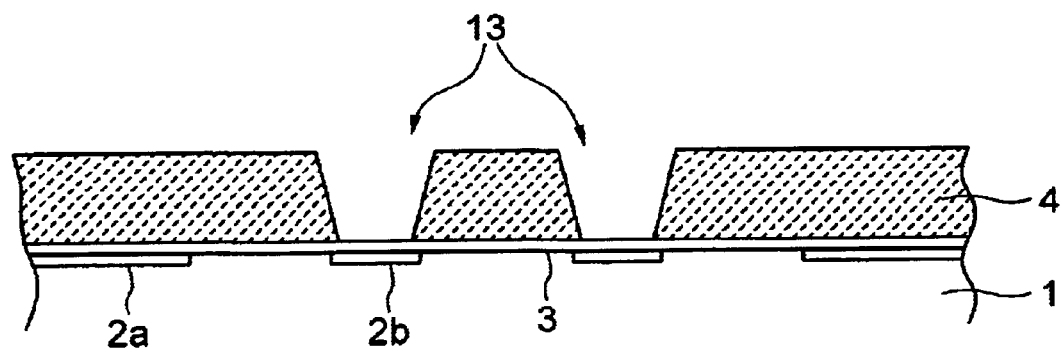
FIG. 25B is a sectional view taken along line B–B' in FIG. 25A.

Thereafter, as shown in FIGS. 25A and 25B, an organic resin film such as made of photosensitive polyimide is formed on the entire surface of the substrate 1, followed by exposure and development thereof to form openings each for receiving therein a beam base at the location overlying a corresponding electrode cover film 2b. Subsequently, the organic resin film is baked for curing at a temperature of about 400 degrees C. to form a first sacrificial film 4 which is later used to achieve a micro-bridge structure. In the present embodiment, the sacrificial film 4 has a portion formed between the areas of the electrode cover films 2b, as depicted in FIG. 25B.

Figure 26A:
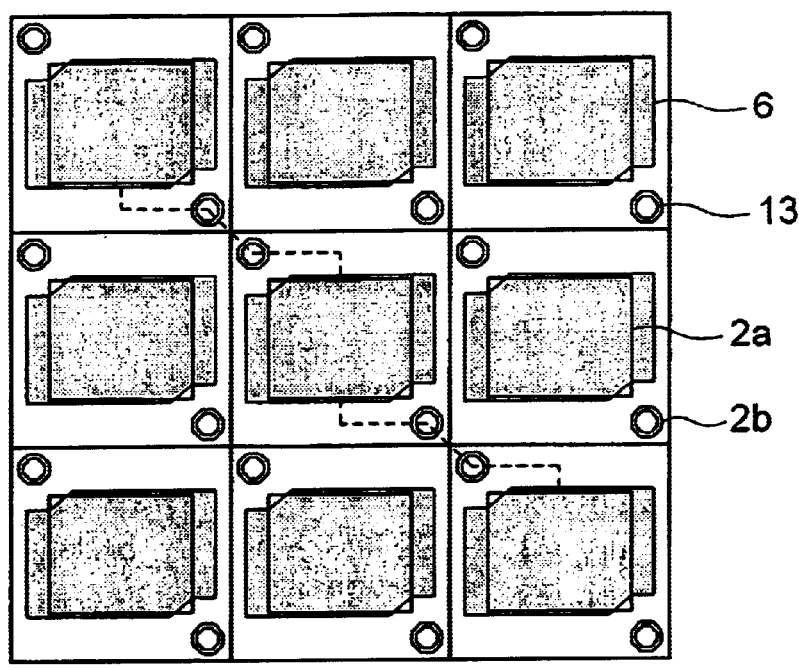
FIG. 26A is a top plan view of the infrared ray detector of the third embodiment during a step in the fabrication process thereof.
Figure 26B:
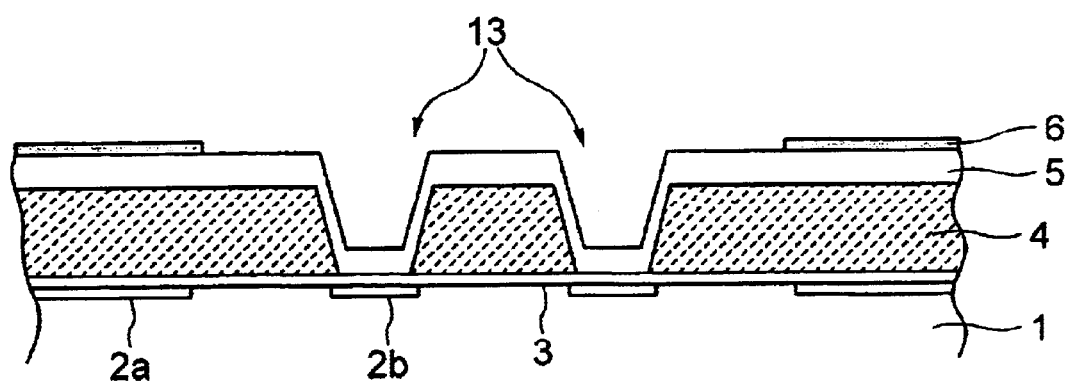
FIG. 26B is a sectional view taken along line B–B' in FIG. 26A.

Thereafter, as shown in FIGS. 26A and 26B, a first protective film 5 is formed on the first sacrificial film 4, followed by deposition and patterning of vanadium oxide to form a bolometer film 6 in each photoreceptor section.

Figure 27A:
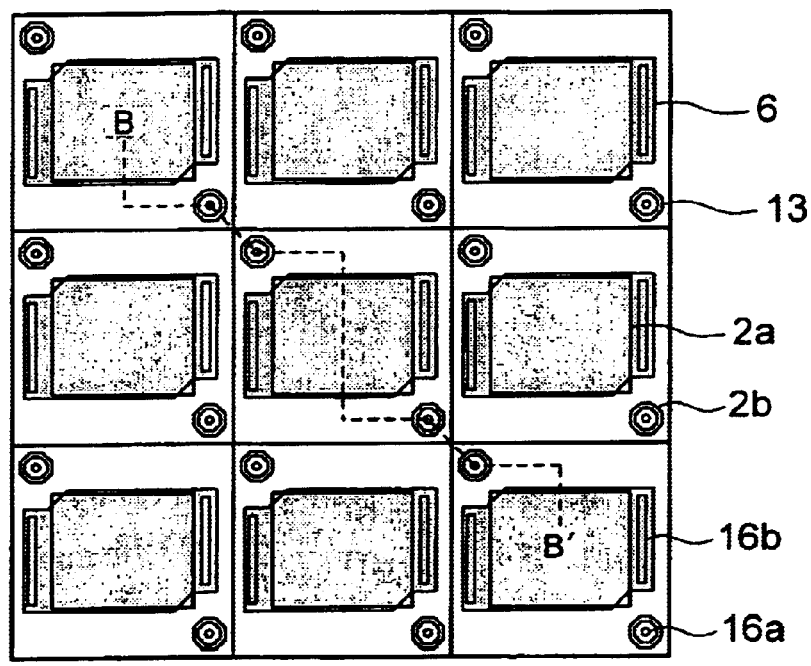
FIG. 27A is a top plan view of the infrared ray detector of the third embodiment during a step in the fabrication process thereof.
Figure 27B:
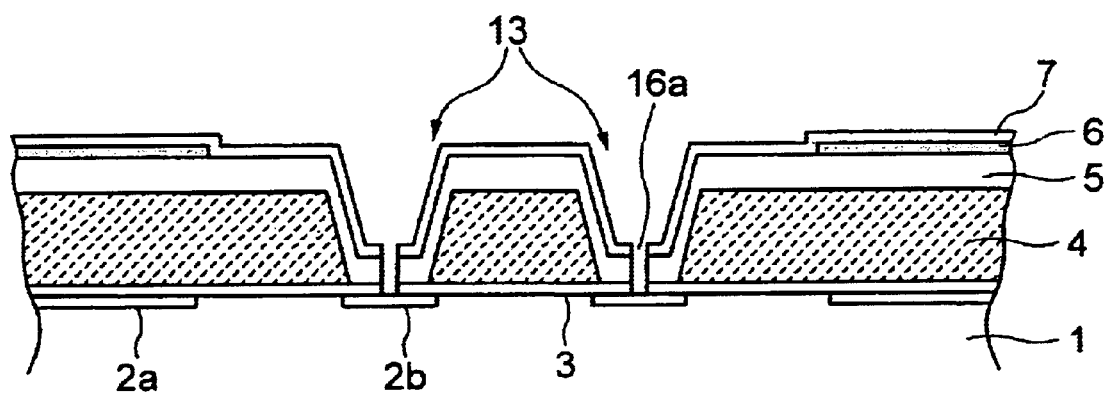
FIG. 27B is a sectional view taken along line B–B' in FIG. 27A.

Subsequently, as shown in FIGS. 27A and 27b, a second protective film 7 is formed on the entire surface including the bolometer films 6, followed by etching the first and second protective films 5 and 7 at the locations overlying the electrode cover films 2b and the second protective film 7 at the locations overlying the bolometer films 6 by a plasma etching technique using a resist pattern as a mask and carbon tetrafluoride as an etching gas, thereby forming contact through-holes 16a and 16b.

Figure 28A:
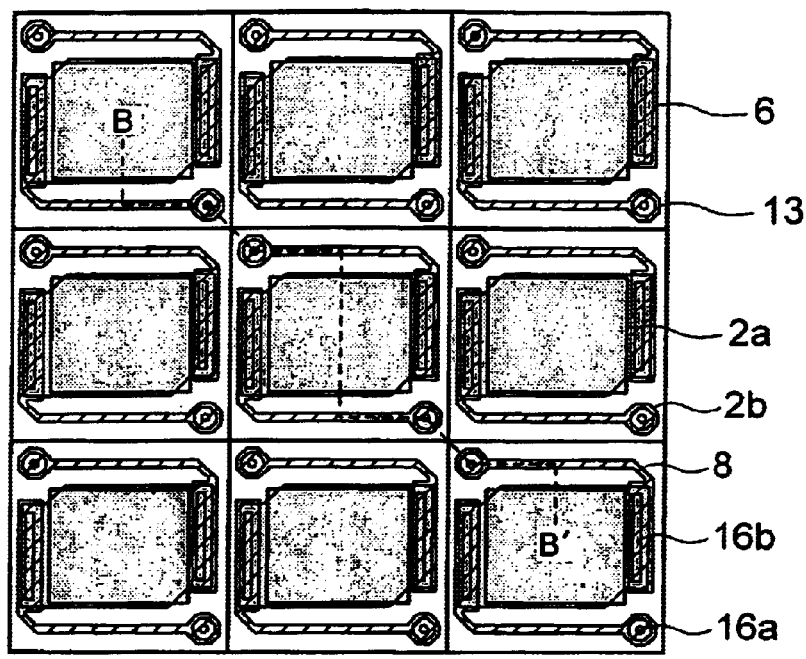
FIG. 28A is a top plan view of the infrared ray detector of the third embodiment during a step in the fabrication process thereof.
Figure 28B:
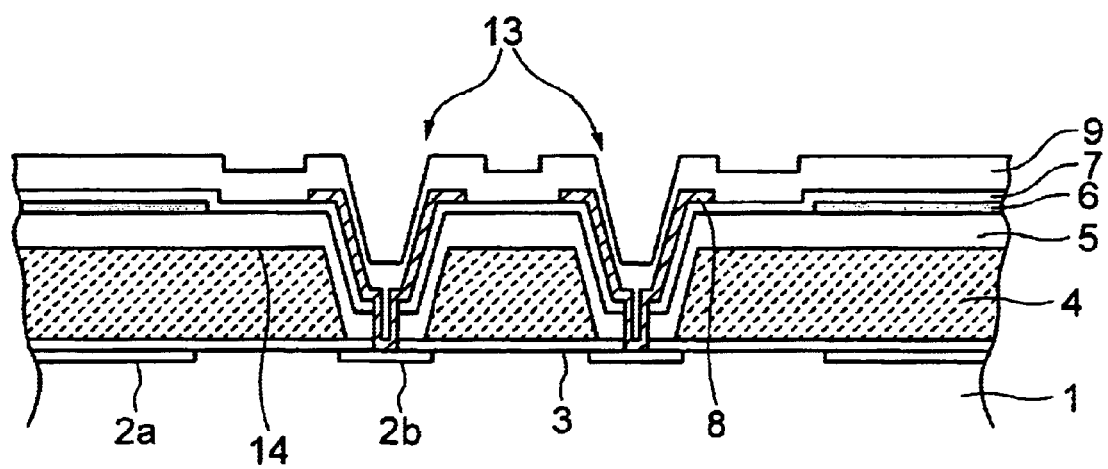
FIG. 28B is a sectional view taken along line B–B' in FIG. 28A.

Subsequently, as shown in FIGS. 28A and 28B, metallic electrode lines 8 are formed which electrically connect the bolometer films 6 to the circuits in the substrate 1 and also function as constituent elements of the beam structure 18 for supporting the bolometer film 6 in spaced relationship with the substrate 1. A third protective film 9 is then formed for protecting the bolometer films 6 and the metallic electrode lines 8. These configurations allow the later etching process for the first and second sacrificial films 4 and 10 to form a micro-bridge structure in each pixel formed by a diaphragm and a pair of beam bases, wherein the diaphragm is supported in spaced relationship with the substrate 1 except for the contact therewith via the beam bases.

Figure 29A:
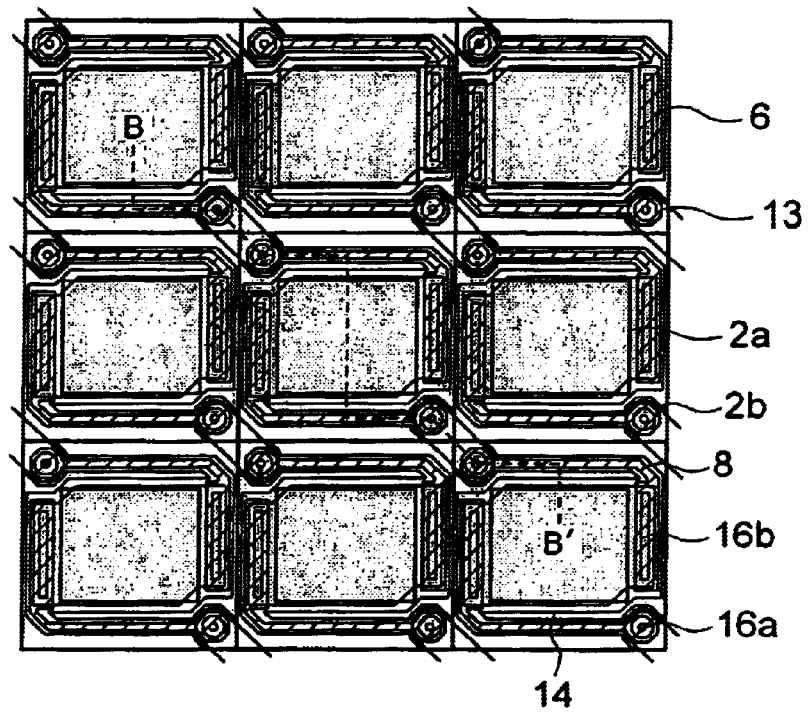
FIG. 29A is a top plan view of the infrared ray detector of the third embodiment during a step in the fabrication process thereof.
Figure 29B:
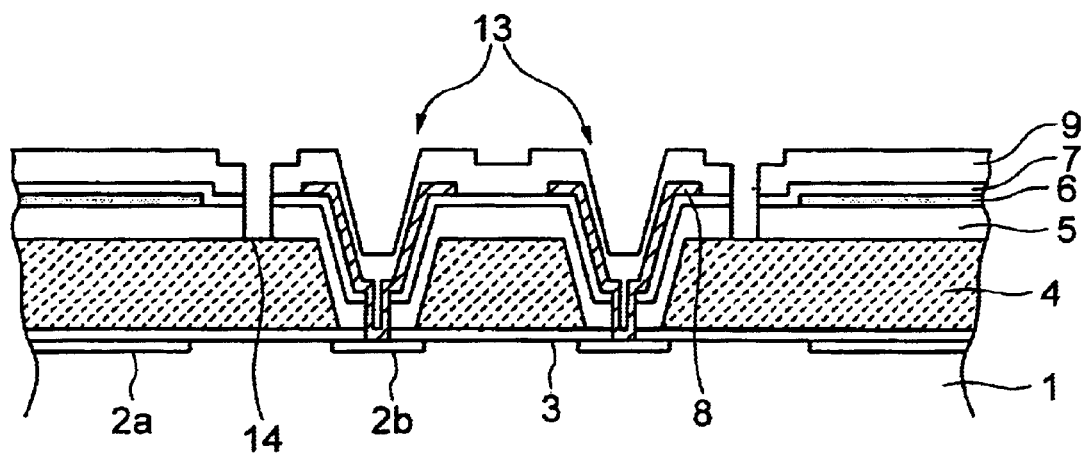
FIG. 29B is a sectional view taken along line B–B' in FIG. 29A.

Thereafter, as shown in FIGS. 29A and 29B, a plasma etching process is conducted to pattern the first through third protective films 5, 7 and 9, thereby forming first through-holes 14 for exposing portions of the first sacrificial film 4 or polyimide film 4. It is preferable that the first through-hole 14 have a larger opening area for convenient removal of the sacrificial film 4.

Figure 30A:
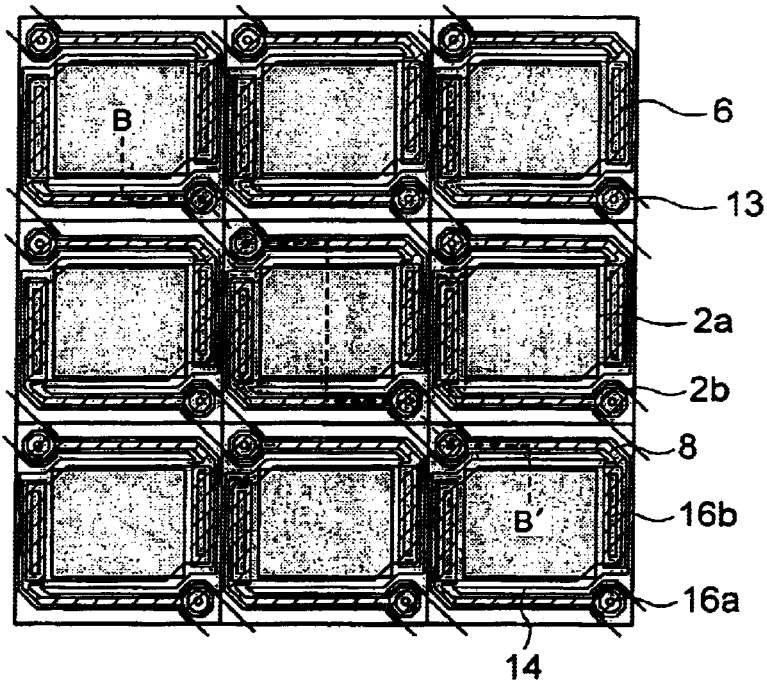
FIG. 30A is a top plan view of the infrared ray detector of the third embodiment during a step in the fabrication process thereof.
Figure 30B:
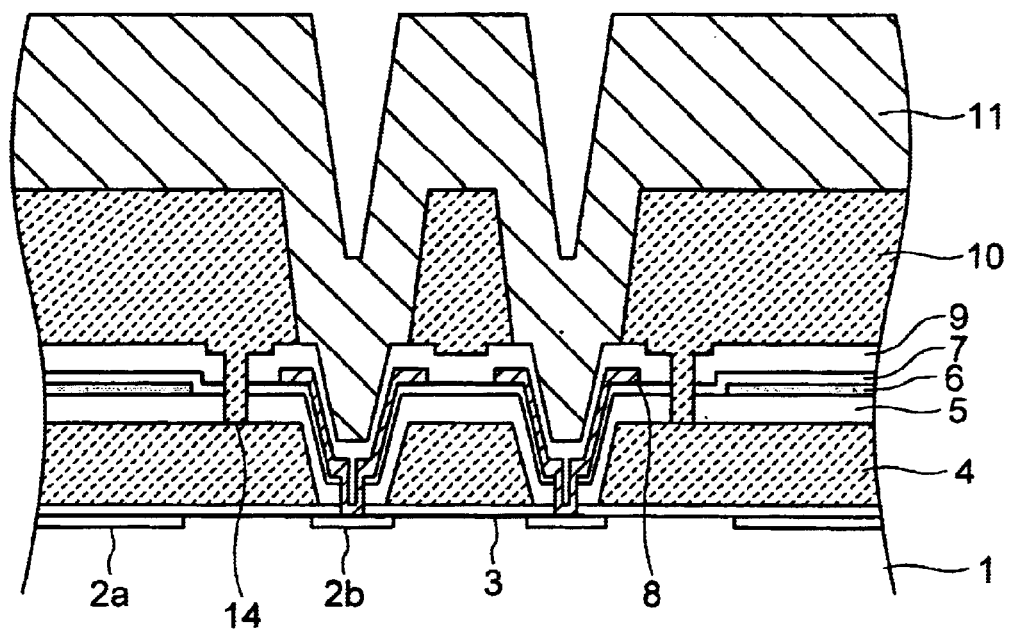
FIG. 30B is a sectional view taken along line B–B' in FIG. 30A.

Subsequently, as shown in FIGS. 30A and 30B, an organic resin film such as made of photosensitive polyimide is formed by coating on the entire surface of the substrate 1, followed by baking thereof for curing at a temperature of about 400 degrees C. to form a second sacrificial film 10. Thereafter, a material for passing therethrough the incident infrared ray, such as amorphous silicon, is deposited to a desired thickness to form a window film 11. In the present embodiment, since the first sacrificial film 4 is formed in the region between adjacent base areas 13 to reduce the step difference, the second sacrificial film 10 has a desired thickness without an increased thickness in the base areas 13, and in addition, the resultant window film 11 has a substantially equal height between the photoreceptor section and the base areas 13.

The amorphous silicon used for the material of the window film 11 may be replaced by polysilicon, copper chloride (CuCl), germanium, zinc selenide (ZnSe), zinc sulfide (ZnS), cadmium sulfide (CdS), etc. An antireflection films such as made of zinc sulfide may be formed on the window film 11, as in the case of the first embodiment.

Figure 31A:
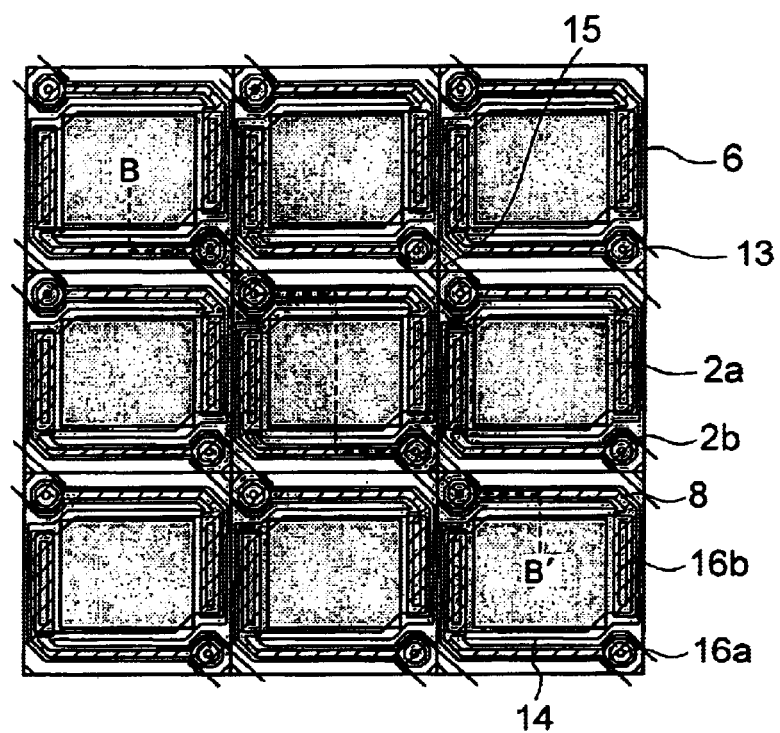
FIG. 31A is a top plan view of the infrared ray detector of the third embodiment during a step in the fabrication process thereof.
Figure 31B:
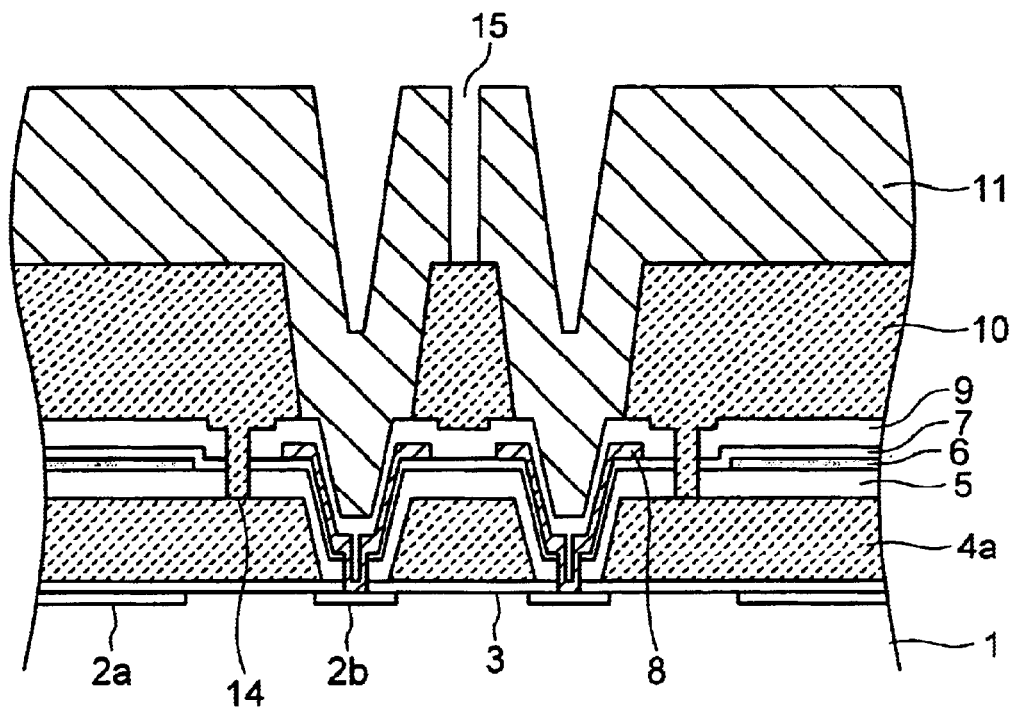
FIG. 31B is a sectional view taken along line B–B' in FIG. 31A.

Thereafter, as shown in FIGS. 31A and 31B, a dry etching process is conducted using a mixture of chlorine based gas and fluorine based gas as an etching gas to form second through-holes 15 in the window film 11 at the locations overlying the second sacrificial film 10 in the base areas 13, thereby exposing portions of the second sacrificial film 10.

Since the step difference is reduced between the base area 13 and the photoreceptor section by the presence of the first sacrificial film 4 in the base area 13, the second sacrificial film 10 and the window film 11 have uniform thicknesses between the base area 13 and the photoreceptor section. This allows the resist pattern used for forming the second through-holes 15 to be formed by excellent resolution, whereby the second through-holes 15 can be formed with excellent dimensional accuracy.

Figure 32A:
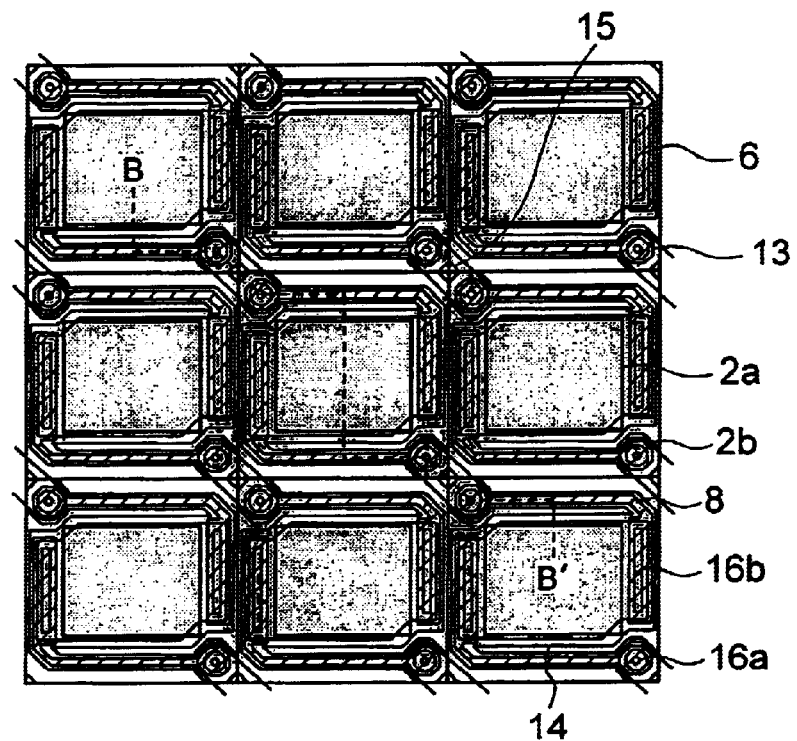
FIG. 32A is a top plan view of the infrared ray detector of the third embodiment during a step in the fabrication process thereof.
Figure 32B:
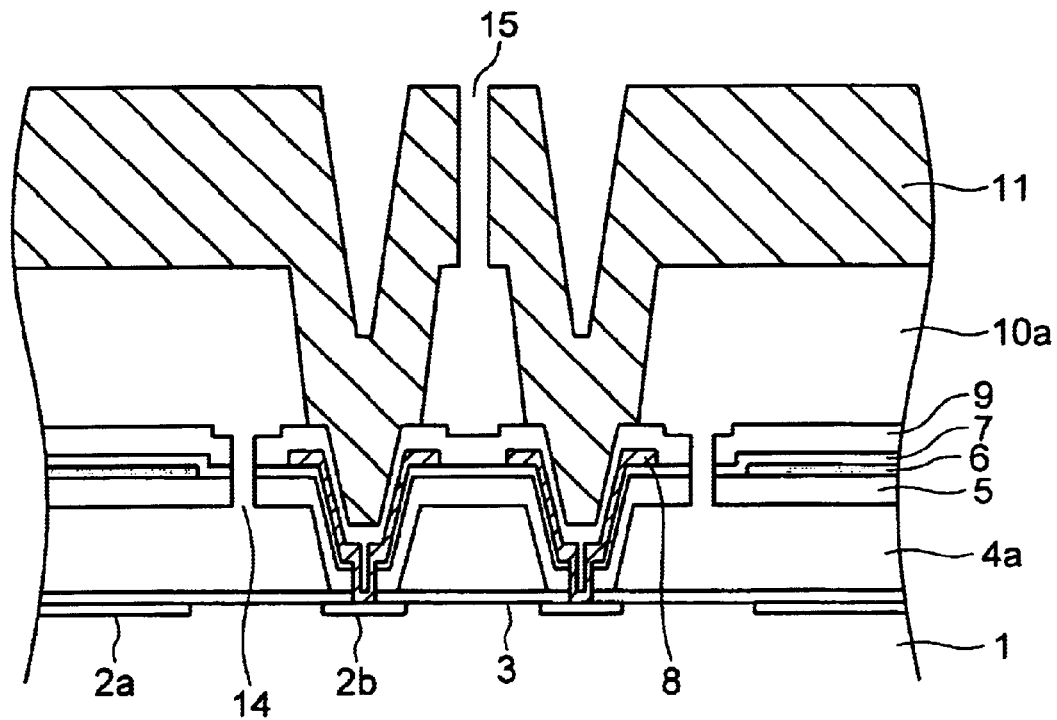
FIG. 32B is a sectional view taken along line B–B' in FIG. 32A.

Thereafter, as shown in FIGS. 32A and 32B, an ashing system is used for removing the first and second sacrificial films 4 and 10 through the second through-holes 15 and the first through-holes 14.

Figure 33A:
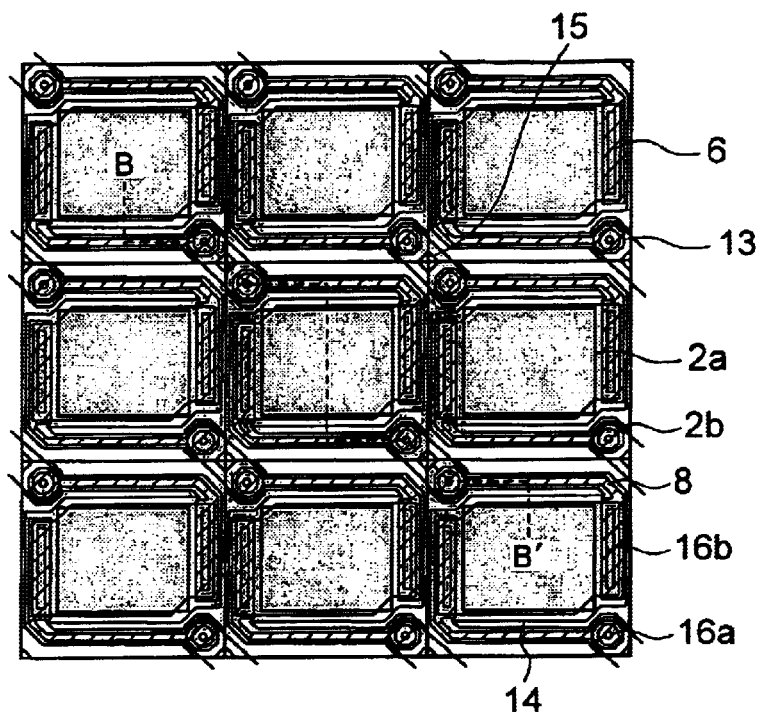
FIG. 33A is a top plan view of the infrared ray detector of the third embodiment during a step in the fabrication process thereof.
Figure 33B:
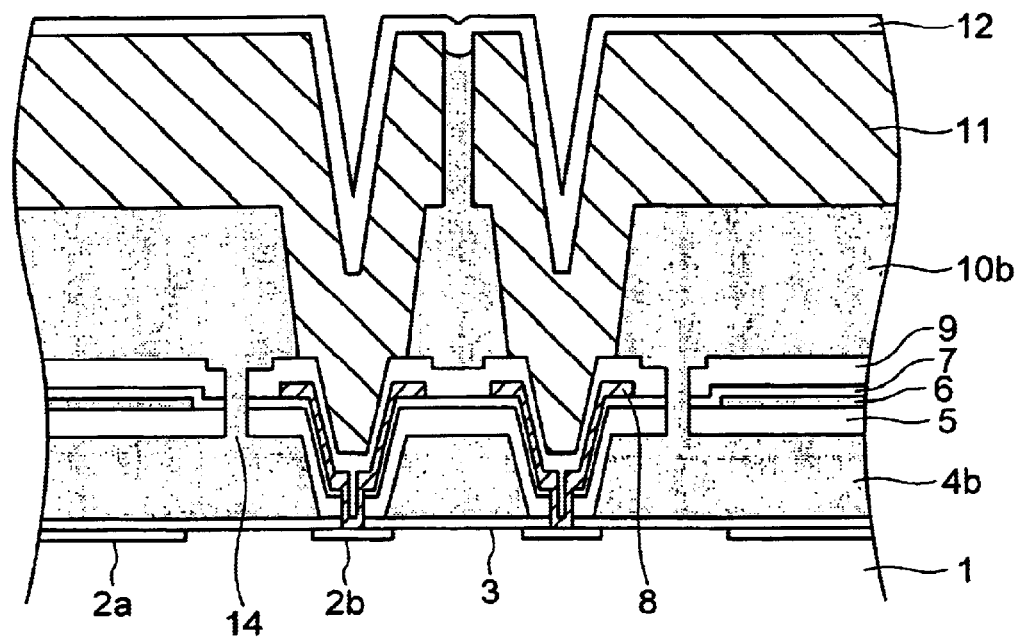
FIG. 33B is a sectional view taken along line B–B' in FIG. 33A.

Subsequently, as shown in FIGS. 33A and 33B, the resultant wafer on which an array of infrared ray detectors each including the window films 11 are formed is introduced into a vacuum deposition chamber, such as a sputtering system. After evacuation of the deposition chamber, inert gas is introduced to increase the vacuum pressure up to about $1 \times 10^{-2}$ Torr. Polysilicon film is then deposited at this pressure to form a vacuum encapsulation film 12, which fills and closes the second through-holes 15 to maintain the vacuum in the vacuum spaces 4b and 10b formed by removing the first and second sacrificial films 4 and 10, respectively.

As in the case of the first embodiment, the polysilicon for the material of the vacuum encapsulation film 12 may be replaced by amorphous silicon, copper chloride (CuCl), germanium, zinc selenide (ZnSe), zinc sulfide (ZnS), cadmium sulfide (CdS) etc.

The third embodiment achieves advantages similar to those of the first embodiment, and also allows the vacuum encapsulation structure to be used in the infrared ray detector irrespective of the arrangement of the base areas. In addition, the reduction of the step difference in the third embodiment achieves accurate dimensions of the second through-holes 15.

Next, an infrared ray detector according to a fourth embodiment of the present invention and a manufacturing process thereof will be described hereinafter with reference to FIGS. 34 to 36. In short, the infrared ray detector of the present embodiment has a separate vacuum space for each pixel.

The separate vacuum space for each of the pixels or micro-bridge structures allows a leakage of a single vacuum space to be limited to the specific single vacuum space, and does not cause any problem for the remaining safe vacuum spaces. That is, a defect of the vacuum space in a single pixel is limited to the single pixel.

Similarly to the foregoing embodiments, reflective films 2a and electrode cover films 2b (not shown) are formed on a substrate 1, followed by deposition of a protective film 3 thereon.

Figure 34:
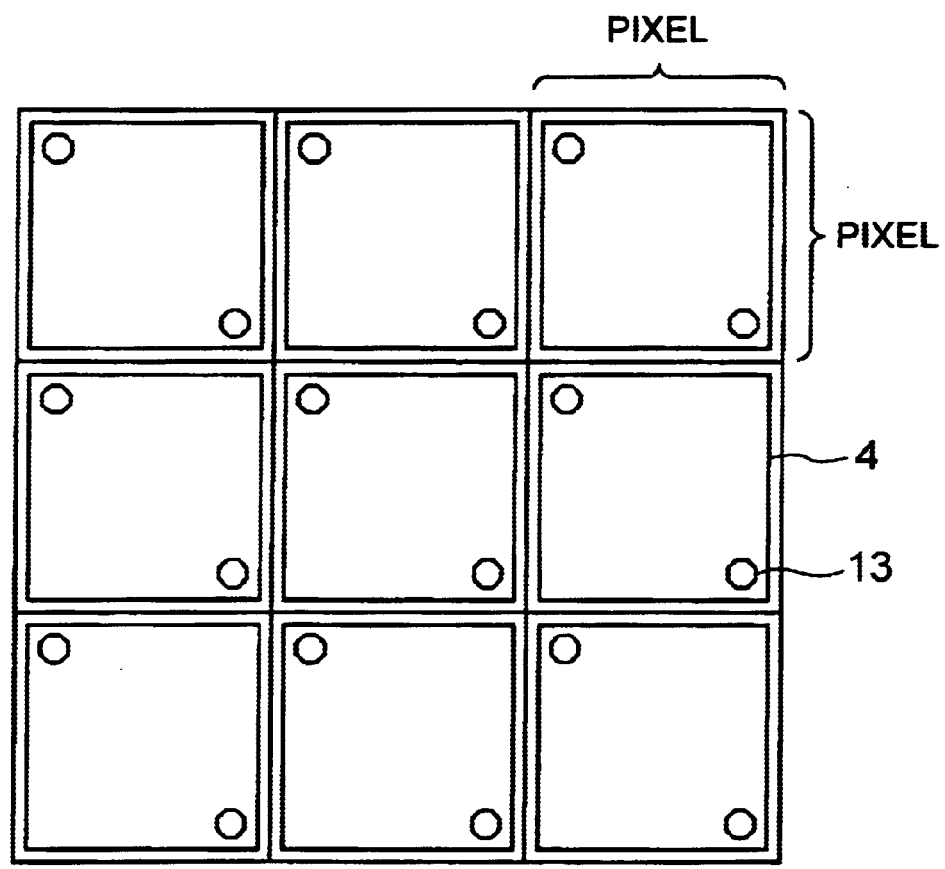
FIG. 34 is a top plan view of an infrared ray detector according to a fourth embodiment of the present invention during a step in the fabrication process thereof.

Thereafter, as shown in FIG. 34, an organic resin film such as made of photosensitive polyimide is formed on the entire surface by coating, followed by patterning thereof to form first sacrificial films 4 in the areas other than the base areas 13 and periphery of each pixel. The base areas 13 in the present embodiment are formed nearer to the center of the pixel compared to the base areas 13 in the foregoing embodiments, in order to form a separate window film for each pixel.

Figure 35:
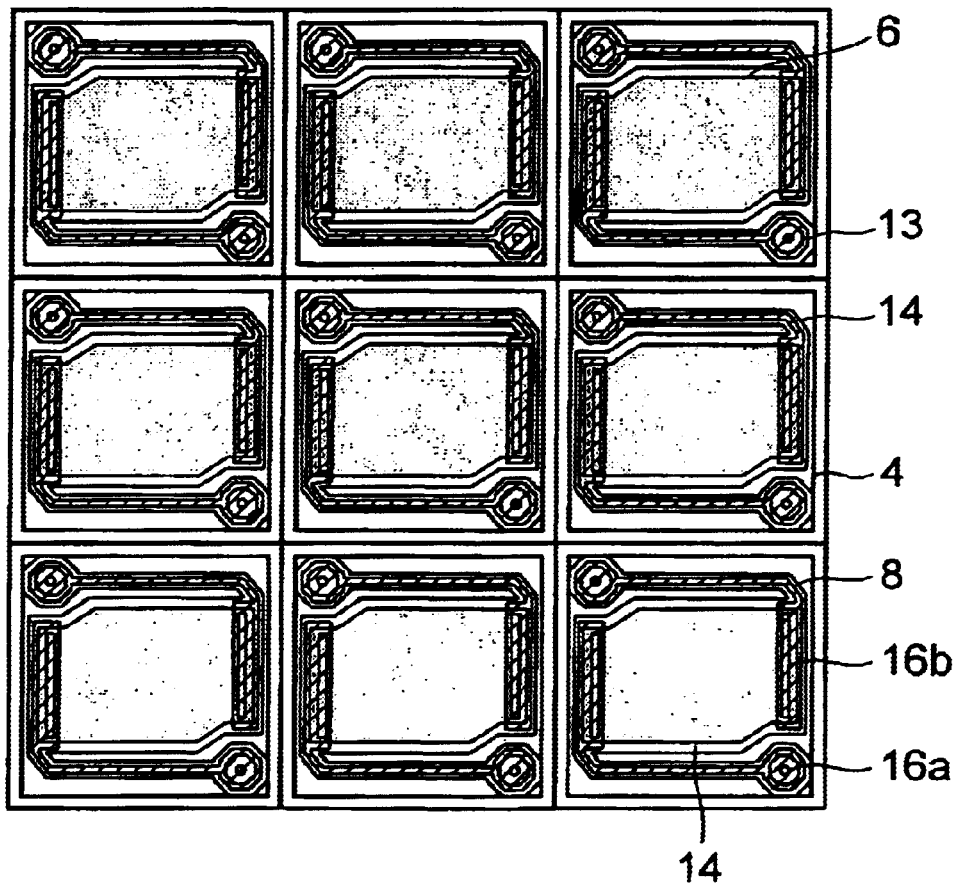
FIG. 35 is a top plan view of the infrared ray detector of the fourth embodiment during a step in the fabrication process thereof.

Subsequently, as shown in FIG. 35, a first protective film 5, a bolometer film 6 and a second protective film 7 are consecutively formed on the first sacrificial film 4, followed by removing the first and second protective films 5 and 7 at the locations overlying the electrode cover films 2b and the second protective film 7 at the locations overlying the bolometer films 6, thereby forming contact through-holes 16a and 16b. Thereafter, metallic electrode lines 8 and a third protective film 9 are consecutively formed thereon. A plasma etching process is then conducted to selectively etch the first through third protective films 5, 7 and 9, thereby forming first through-holes 14 at specified locations on the first sacrificial films 4.

Figure 36:
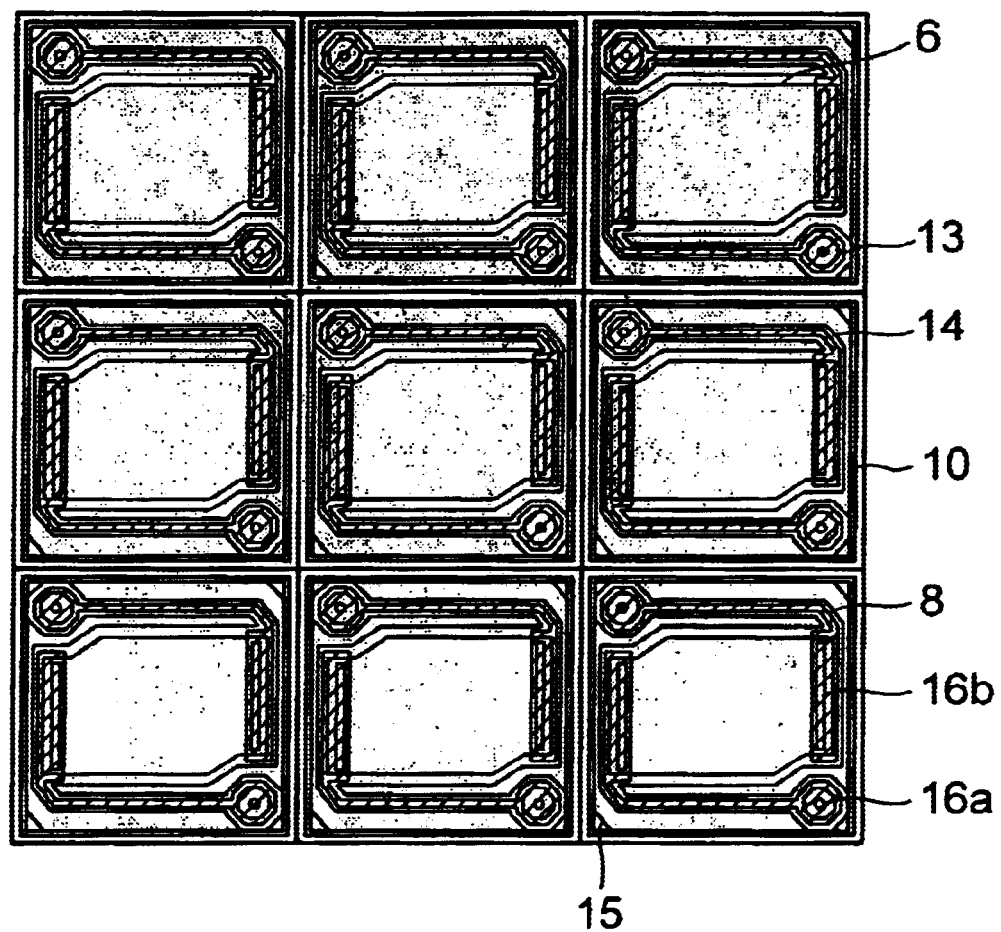
FIG. 36 is a top plan view of the infrared ray detector of the fourth embodiment during a step in the fabrication process thereof.

Thereafter, as shown in FIG. 36, an organic resin film such as made of photosensitive polyimide is formed on the entire surface of the substrate 1, followed by patterning and baking thereof for curing at a temperature of about 400 degrees C. to form separate second sacrificial films 10 in the respective pixel areas. A window film 11 is then formed thereon by deposition of amorphous silicon, and patterned by a dry etching process using a mixture of chlorine based gas and fluorine based gas to form second through-holes 15 at the corner portions of each pixel opposing the base areas 13 for exposing portions of the second sacrificial films 10.

An ashing system is then used for removing the first and second sacrificial films 4 and 10 through the first and second through-holes 14 and 15. The resultant wafer is then introduced into a vacuum deposition chamber, such as a sputtering chamber, which is eventually evacuated and allows inert gas to be introduced therein. A vacuum encapsulation film 12 is then formed in the vacuum ambient to fill the second through-holes 15.

The fourth embodiment is such that the second sacrificial films 10 are separated from one another corresponding to the pixels. This configuration allows the window film 11 to be fixed onto the substrate 1 at each of the four sides of the pixel, and a separate vacuum space can be obtained for each pixel. The configuration also allows the fixing part between the window film 11 and the substrate 1 to have a larger length, and allows the window film 11 to have a convex surface whereby the withstand capability of the window film 11 against the atmospheric pressure can be improved. The present embodiment also achieves reduction of the thickness of the window film 11, whereby a total thickness of 2 micrometers for the window film 11 and the vacuum encapsulation film 12 is sufficient for the external wall of the vacuum space for a square pixel of 37×37 micrometers, with a vacuum pressure at $1\times10^{-2}$ Torr.

In the present embodiment, since the periphery of each pixel is formed as a base of the beam structure, the effective opening ratio of each pixel resides at around 36 percents. However, the present embodiment is suited to a mass production with a higher product yield due to a lower leakage rate of the vacuum spaces, and with smaller man-hours due to a smaller thickness of the window film 11.

Figure 37:
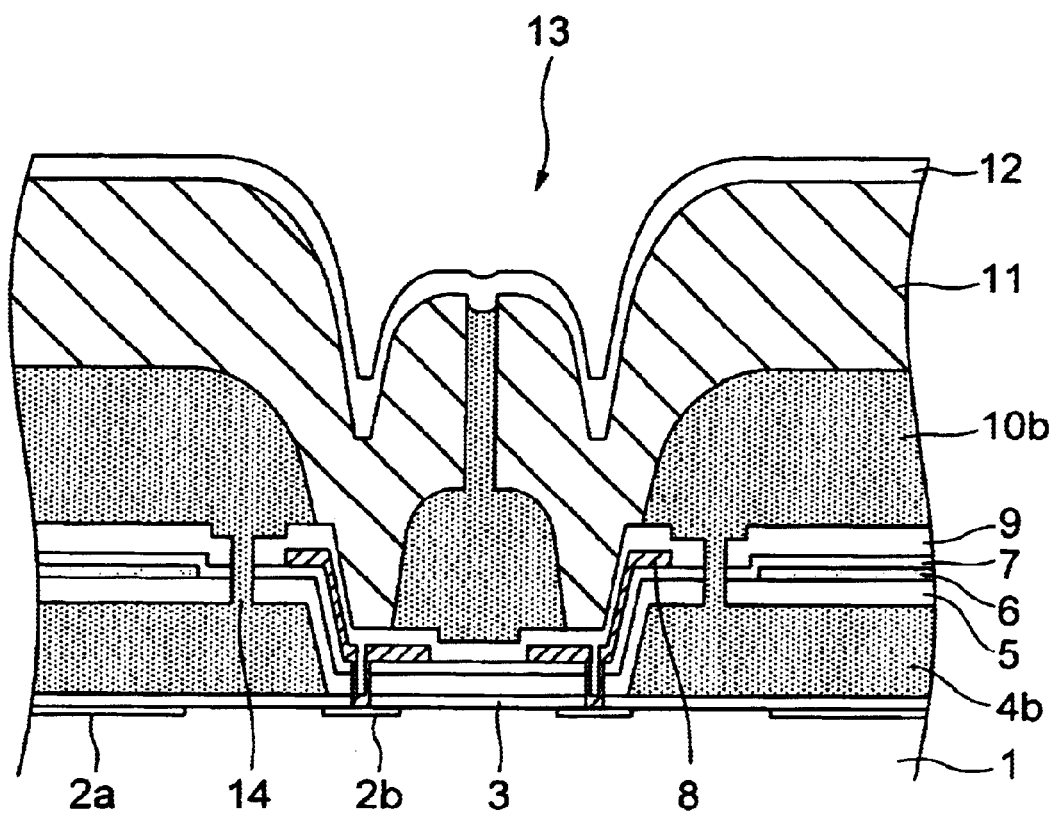
FIG. 37 is a sectional view of an infrared ray detector according to a fifth embodiment of the present invention during a step in the fabrication process thereof.
Figure 38:
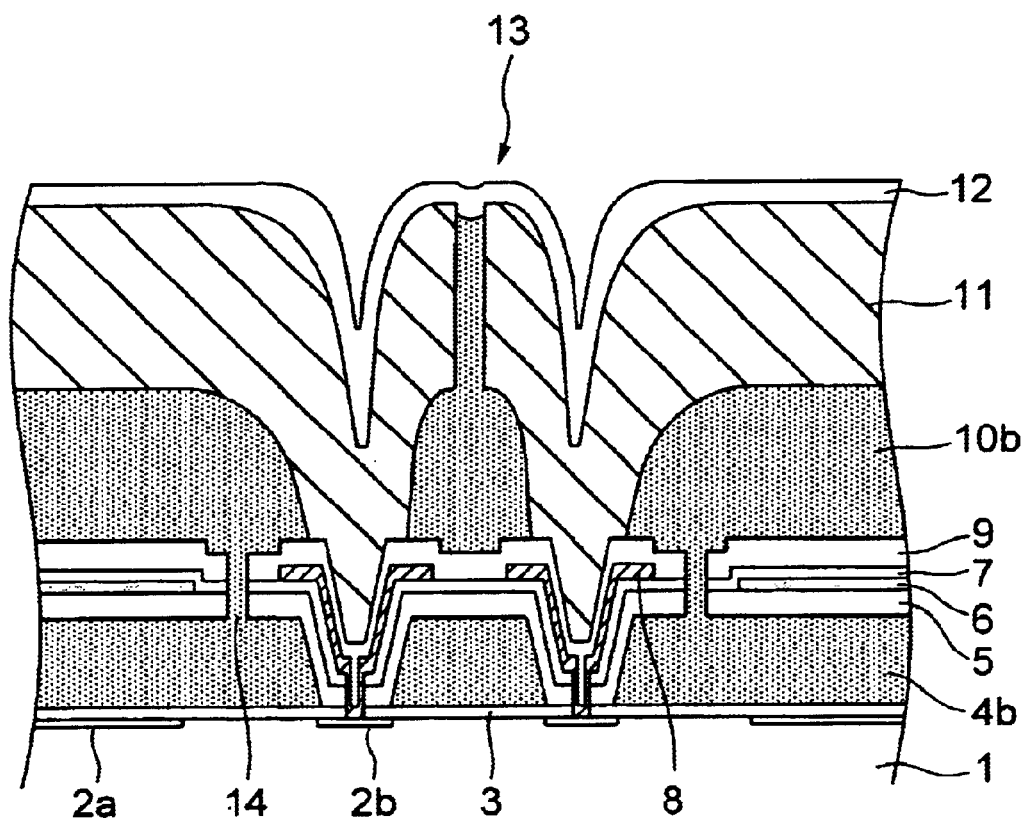
FIG. 38 is a sectional view of the infrared ray detector of the fifth embodiment during a step in the fabrication process thereof.

Next, an infrared ray detector according to a fifth embodiment of the present invention and a fabrication process thereof will be described with reference to FIGS. 37, 38, 39A and 39B. FIGS. 37 and 38 are sectional views of the infrared ray detector of the present embodiment, FIGS. 39A and 39B are sectional views of the infrared ray detector at respective steps in the fabrication process thereof.

In the foregoing embodiments of the present invention, the second sacrificial film 10 is substantially of a hexahedron having is vertical sides or slightly tapered sides. In the present embodiment, the shape of the second sacrificial film 10 is changed to allow the shape of the window film 11 to be changed for achieving an improved withstand pressure.

As shown in FIGS. 37 and 38, for example, the vacuum space 10b obtained by removing the second sacrificial film 10 in the present embodiment has a curved, convex top surface. This configuration allows the overlying window film 11 to have a higher mechanical strength against an external force applied by the pressure difference between the vacuum space and the ambient pressure, even without a larger thickness of the window film 11.

Figure 39A:
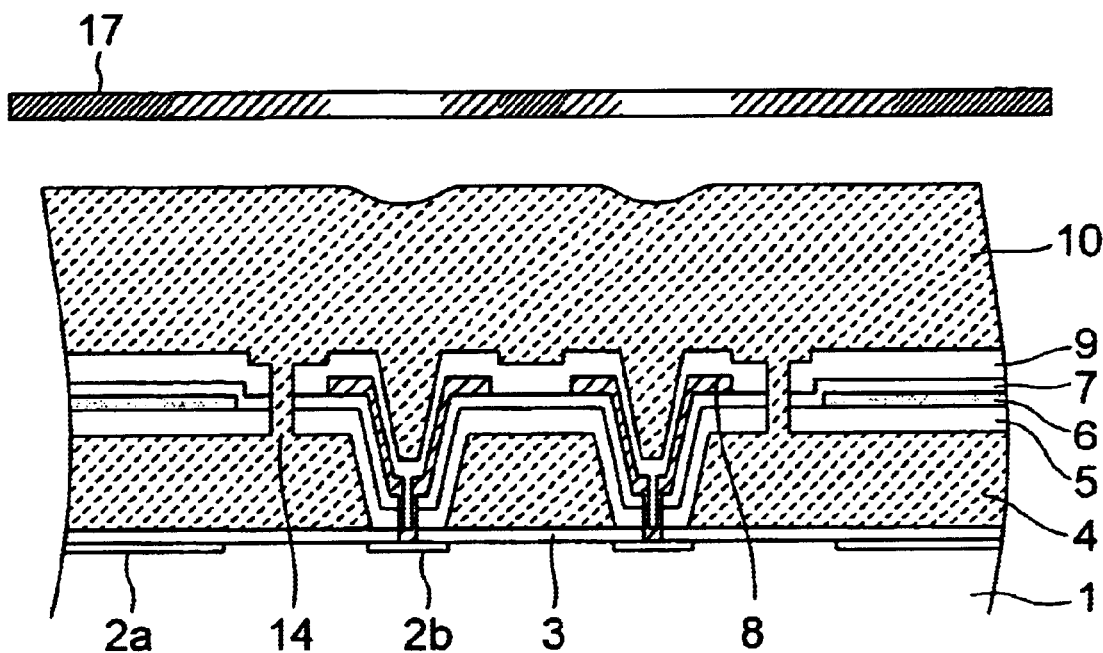
FIGS. 39A and 39B are sectional views of the infrared ray detector of the fifth embodiment during steps in the fabrication process thereof.
Figure 39B:
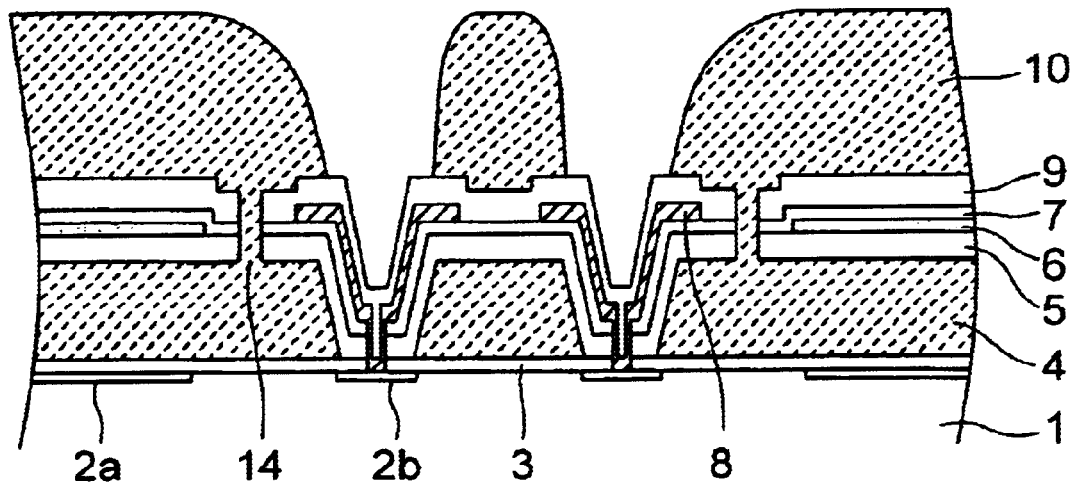

For achieving the curved, convex top surface for the second sacrificial film, as shown in FIG. 39A, a half-tone mask 17 is used for exposure of the second sacrificial film 10 to the exposure light. The half-tone mask may have an increased transmittance profile for exposure light as viewed in a direction from the center to the periphery of the patterned second sacrificial film 10. Alternatively, the peripheral area of the second sacrificial film 10 may be subjected to iterated exposure steps or a longer-time development step with the central area being subjected to a less number of exposure steps or a shorter-time development. The half-tone mask or iterated exposure provides a curved, smooth, convex surface to the second sacrificial film as shown in FIG. 39B. The window film 11 deposited on the curved, convex surface of the second sacrificial film 10 has also curved, smooth, convex surface, thereby improving the withstand pressure thereof.

Figure 40A:
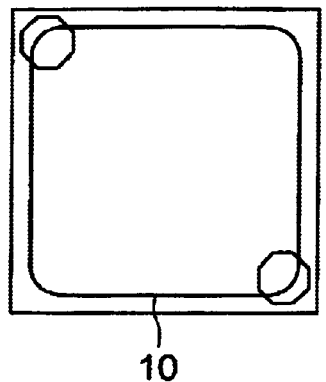
FIGS. 40A and 40B are a top plan view and a sectional view, respectively, of an infrared ray detector according to a modification of the fifth embodiment.
Figure 40B:
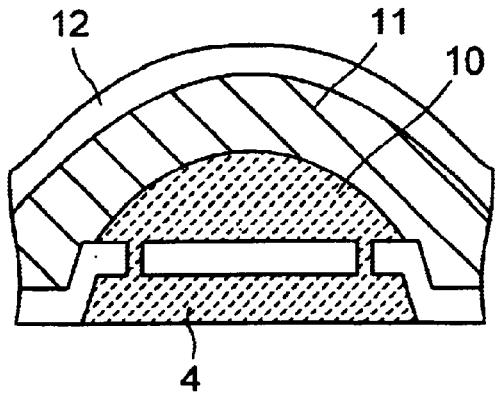
Figure 40C:
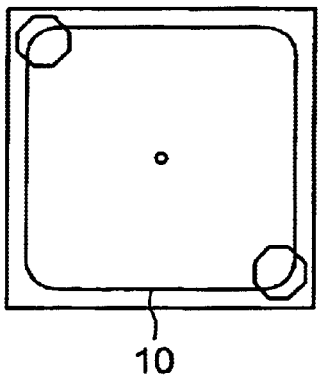
FIGS. 40C and 40D are a top plan view and a sectional view, respectively, of an infrared ray detector according to another modification of the fifth embodiment.
Figure 40D:
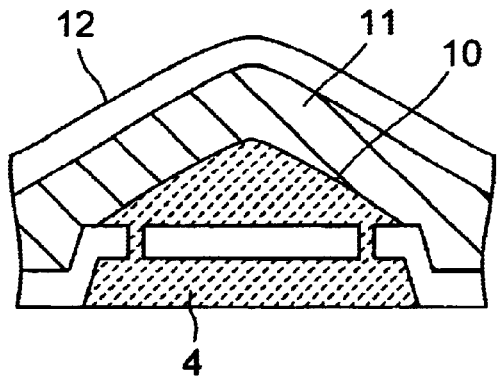
Figure 40E:
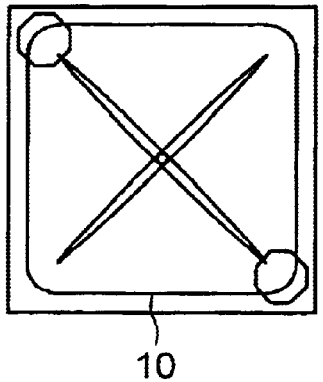
FIGS. 40E and 40F are a top plan view and a sectional view, respectively, of an infrared ray detector according to another modification of the fifth embodiment.
Figure 40F:
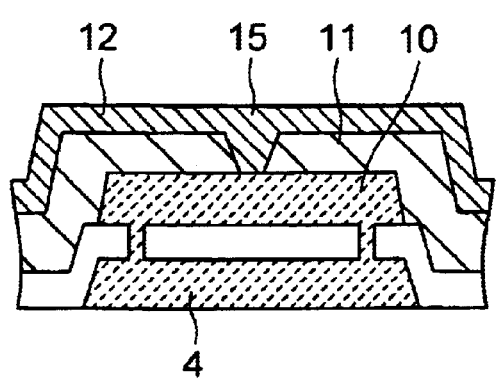
Figure 41:
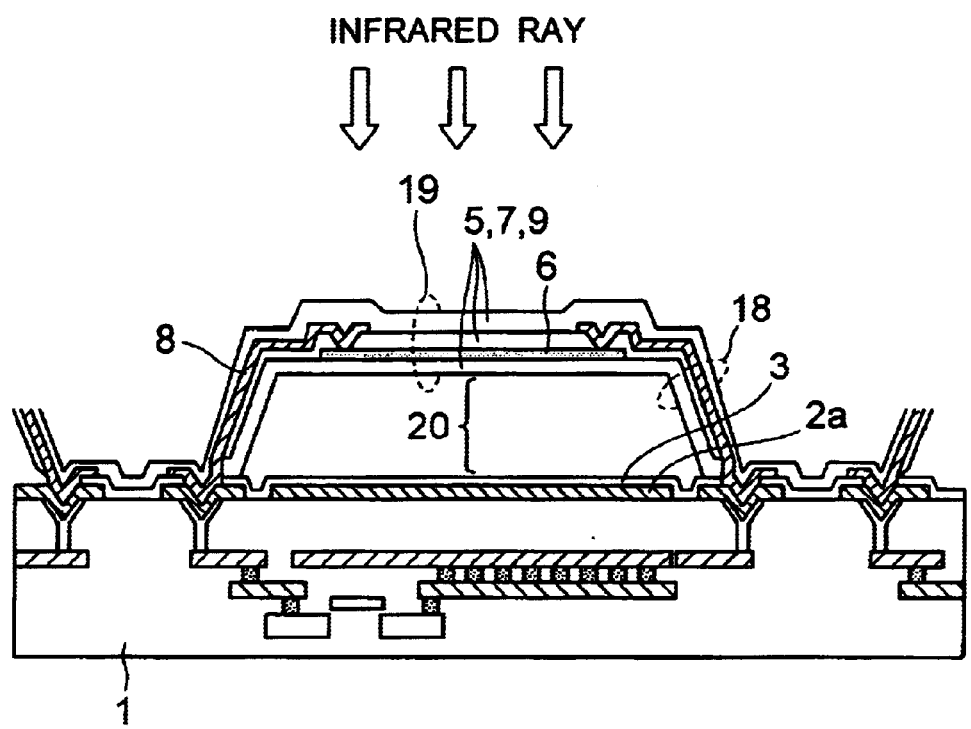
FIG. 41 is a sectional view of a conventional infrared ray detector.
Figure 42:
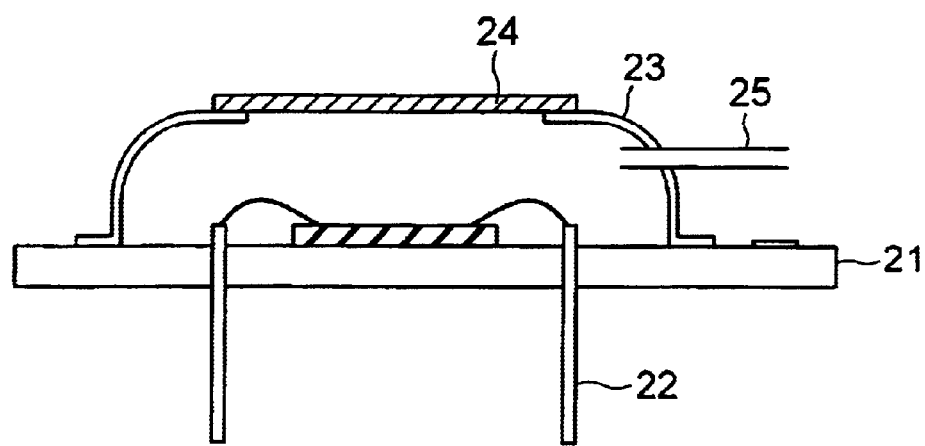
FIG. 42 is a sectional view of the conventional infrared ray detector of FIG. 41 during a vacuum encapsulation step thereof.
Figure 43:
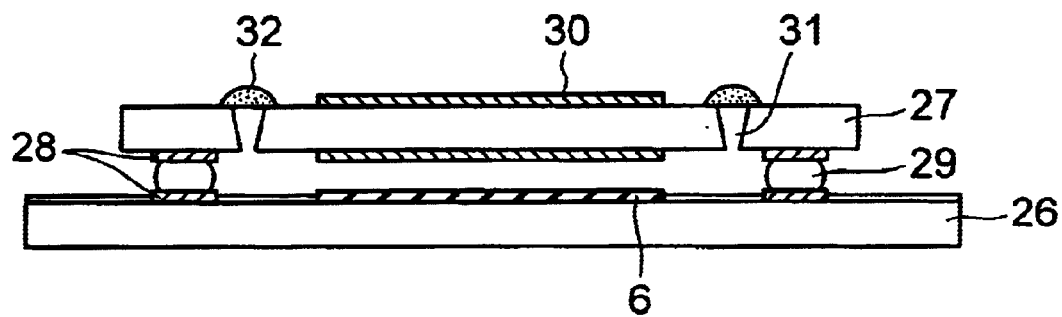
FIG. 43 is a sectional view of another conventional infrared ray detector during a vacuum encapsulation step thereof.

In modifications of the fifth embodiment, the window film 11 may have different shapes such as shown in FIGS. 40A to 40F, wherein FIGS. 40A and 40B show a top plan view and a sectional view, respectively, of a first modification, FIGS. 40C and 40D show a top plan view and a sectional view, respectively, of a second modification, and FIGS. 40E and 40F show a top plan view and a sectional view, respectively, of a third modification.

The first modification of the window film 11 has a substantially hemispheric top surface depending on the hemispheric top surface of the second sacrificial film 10, as shown in FIGS. 40A and 40B. The second modification of the window film 11 has a conical top surface (or a pyramid top surface) depending on the conical top surface (or the pyramid top surface) of the second sacrificial film 10, as shown in FIGS. 40C and 40D. These window films can be formed by the half-tone mask such as shown in FIG. 39A, for example. Conversely, the window film 11 may have a concave top surface by using a second sacrificial film having a concave top surface.

In the foregoing embodiments, the second through-holes 15 are formed in the window film 11 at base areas 13 or at the corners opposing the base areas 13. However, the second through-holes 15 may be provided on the photoreceptor section because the vacuum encapsulation film 12 filling the second through-holes 15 can be made of a material which allows the incident infrared ray to pass therethrough. The third modification shown in FIGS. 40E and 40F has such a structure, wherein elongate second through-holes 15 are formed along diagonal lines of the square pixel.

If the second through-hole 15 formed in the window film 11 on the photoreceptor section is tapered, with the internal side of the through-hole 15 being narrower, and the second through-hole 15 is filled with an vacuum encapsulation film 12 having a larger hardness as shown in FIG. 40F, then the vacuum encapsulation structure has a higher withstand pressure because the portion of the vacuum encapsulation film 12 filling the second through-hole 15 functions as a beam or strut.

The structures and the shapes of the second sacrificial film 10, window film 11 and second through-hole 15 described heretofore are only for examples, and thus may be modified as desired. For example, each of the convex structures of the window films 11 shown in FIGS. 40B and 40D may be combined with the beam structure shown in FIG. 40F.

The present invention may be applied to other devices having a vacuum encapsulation structure, such as a cooled infrared ray detector, as well as the thermally-sensitive infrared ray detector as described above.

The infrared ray detectors of the above embodiments achieve the advantages as follows:

(1) Since the micro-bridge structure of the infrared ray detector is protected by the window film after the etching of the sacrificial films, mechanical damages on the micro-bridge structure can be prevented;

(2) The conventional package having a window material such as germanium or having an exhaust tube is not needed and the infrared ray detector can be manufactured without using a particular or expensive system;

(3) The vacuum in the vacuum spaces can be maintained for a long time, thereby improving the long-term reliability of the infrared ray detector;

(4) In some embodiments, the window film can be formed to have a concave structure, which improves the withstand pressure of the window film, and may reduce the transmittance lass of the window film due to a smaller thickness thereof; and (5) The package for the infrared ray detector can be made small due to the vacuum encapsulation structure directly formed on the chip of the infrared ray detector, whereby the package need not have a specific vacuum maintaining structure.

Since the above embodiments are described only for examples, the present invention is not limited to the above embodiments and various modifications or alterations can be easily made therefrom by those skilled in the art without departing from the scope of the present invention.

What is claimed is:

1. An infrared ray detector comprising a substrate and at least one pixel overlying said substrate and having a microbridge structure, said pixel including:
   a diaphragm having therein a bolometer film;
   a beam structure supporting said diaphragm in spaced relationship with said substrate and fixed in a base area of said substrate; and
   a vacuum encapsulation structure overlying said diaphragm with a vacuum space being disposed therebetween, said vacuum encapsulation structure being supported by said substrate.

2. The infrared ray detector according to claim 1, wherein said vacuum encapsulation structure is fixed in said base area.

3. The infrared ray detector according to claim 1, wherein said at least one pixel include an array of pixels, said vacuum encapsulation structure is supported at a periphery of each pixel, and said vacuum space is disposed for each said pixel.

4. The infrared ray detector according to claim 1, wherein said vacuum encapsulation structure includes a window film for passing therethrough incident infrared ray and a vacuum encapsulation film formed thereon.

5. The infrared ray detector according to claim 4, wherein said window film has therein a through-hole overlying said diaphragm, and said through-hole is filled with said vacuum encapsulation film.

6. The infrared ray detector according to claim 5, wherein said through-hole has an elongate sectional area which extends across said diaphragm.

7. The infrared ray detector according to claim 4, wherein said window film has therein a through-hole overlying said base area.

8. The infrared ray detector according to claim 4, wherein said window film has a thickness ranging between 2 and 50 micrometers.

9. The infrared ray detector according to claim 4, wherein said window film includes at least one of silicon, copper chloride, germanium, zinc selenide, zinc sulfide and cadmium sulfide.

10. The infrared ray detector according to claim 1, wherein said vacuum encapsulation structure has a convex surface in said pixel.

11. The infrared ray detector according to claim 10, wherein said vacuum encapsulation structure has either semispherical surface, conical surface or pyramid surface.

* * * * *